United States Patent
Rajendran et al.

(10) Patent No.: US 10,683,454 B2
(45) Date of Patent: Jun. 16, 2020

(54) PHOSPHOR, METHOD FOR PREPARING PHOSPHOR, OPTOELECTRONIC COMPONENT, AND METHOD FOR PRODUCING OPTOELECTRONIC COMPONENT

(71) Applicant: Everlight Electronics Co., Ltd., New Taipei (TW)

(72) Inventors: Veeramani Rajendran, Madurai (IN); Mu-Huai Fang, Taoyuan (TW); Ru-Shi Liu, Taipei (TW); Ho Chang, New Taipei (TW); Kuang-Mao Lu, New Taipei (TW); Yan-Shen Lin, New Taipei (TW); Chieh-Yu Kang, New Taipei (TW); Gabriel Nicolo A. De Guzman, Laguna (PH); Shu-Fen Hu, Taipei (TW)

(73) Assignee: Everlight Electronics Co., Ltd., New Taipei ( * ) Notice: Subject to any disclaimer, the term of this patent is extended or adjusted under 35 U.S.C. 154(b) by 0 days.

(21) Appl. No.: 16/165,954

(22) Filed: Oct. 19, 2018

(65) Prior Publication Data
US 2019/0194539 A1    Jun. 27, 2019

Related U.S. Application Data

(60) Provisional application No. 62/608,969, filed on Dec. 21, 2017, provisional application No. 62/637,788, filed on Mar. 2, 2018.

(51) Int. Cl.
*C09K 11/77* (2006.01)
*H01L 33/50* (2010.01)
(Continued)

(52) U.S. Cl.
CPC .......... *C09K 11/7776* (2013.01); *C09K 11/62* (2013.01); *C09K 11/66* (2013.01);
(Continued)

(58) Field of Classification Search
None
See application file for complete search history.

(56) References Cited

U.S. PATENT DOCUMENTS

2007/0045648 A1* 3/2007 Lin .................. H01L 25/0753
                                                                257/99
2009/0065790 A1* 3/2009 Chitnis .................. H01L 33/44
                                                                257/88

FOREIGN PATENT DOCUMENTS

CN        105199732    * 12/2015   ............. C09K 11/80

OTHER PUBLICATIONS

S. Zhang et al., La3GaGe5O16:Cr3+ phosphor: the near-infrared persistent luminescence, Optical Materials Express, Apr. 1, 2016 (published Mar. 18, 2016), vol. 6, No. 4, No. 255524, all pages (Year: 2016).*

(Continued)

*Primary Examiner* — Victoria K. Hall
(74) *Attorney, Agent, or Firm* — Chen Yoshimura LLP

(57) ABSTRACT

The present invention relates to a phosphor, a method for preparing the phosphor, an optoelectronic component, and a method for producing the optoelectronic component. The phosphor has the following general formula: $La_{3(1-x)}Ga_{1-y}Ge_{5(1-z)}O_{16}$: $3xA^{3+}$, $yCr^{3+}$, $5zB^{4+}$, where x, y, and z do not equal to 0 simultaneously; A represents at least one of Gd and Yb; B represents at least one of Sn, Nb, and Ta. For the phosphor, its emission spectrum is within a red visible light region and a near-infrared region when excited by blue visible light, purple visible light or ultraviolet light; and it has a wide reflection spectrum and a high radiant flux.

(Continued)

Therefore, it can be used in optoelectronic components such as LEDs to meet requirements of current medical testing, food composition analysis, security cameras, iris/facial recognition, virtual reality, gaming notebook and light detection and ranging applications.

12 Claims, 15 Drawing Sheets

(51) Int. Cl.
    *C09K 11/66*     (2006.01)
    *C09K 11/62*     (2006.01)
    *H01L 33/48*     (2010.01)
    *H01L 33/00*     (2010.01)

(52) U.S. Cl.
    CPC .......... *C09K 11/77* (2013.01); *C09K 11/7707* (2013.01); *C09K 11/7708* (2013.01); *C09K 11/7766* (2013.01); *C09K 11/7775* (2013.01); *H01L 33/502* (2013.01); *H01L 33/005* (2013.01); *H01L 33/486* (2013.01); *H01L 33/501* (2013.01); *H01L 2933/0041* (2013.01)

(56) References Cited

OTHER PUBLICATIONS

J. Zhou and Z. Xia, Synthesis and near-infrared luminescence of La3GaGe5O16:Cr3+ phosphors, The Royal Society of Chemistry Advances, 2014, vol. 4, pp. 46313-46318 (Year: 2014).*

Machine translation, Qiu, CN 105199732, Espacenet, translation date: Aug. 19, 2019, all pages. (Year: 2019).*

Zhang et al., "La3GaGe5O16:Cr3+ phosphor: the near-infrared persistent luminescence", Optical Materials Express, Apr. 1, 2016, vol. 6, No. 4, pp. 1247-1255.

Zhou et al., "Synthesis and near-infrared luminescence of La3GaGe5O16:Cr3+ phosphors", RSC Advances, 2014, vol. 4, pp. 46313-46318.

Zhou et al., "Multi-color emission evolution and energy transfer behavior of La3GaGe5O16:Tb3+,Eu3+ phosphors", Journal of Materials Chemistry C, Sep. 14, 2014, vol. 2, No. 34, pp. 6978-6984.

Zhang et al., "Novel La3GaGe5O16 : Mn4+ based deep red phosphor: a potential color converter for warm white light", RSC Advances, 2015, vol. 5, pp. 90499-90507.

* cited by examiner

- ■ $La_{2.97}Ga_{0.99}Ge_{4.975}O_{16}$: $0.03Gd^{3+}$: $0.01Cr^{3+}$: $0.025Sn^{4+}$
- ✳ $La_{2.97}Ga_{0.99}Ge_{4.95}O_{16}$: $0.03Gd^{3+}$: $0.01Cr^{3+}$: $0.05Sn^{4+}$
- ▲ $La_{2.97}Ga_{0.99}Ge_{4.925}O_{16}$: $0.03Gd^{3+}$: $0.01Cr^{3+}$: $0.075Sn^{4+}$
- ▼ $La_{2.97}Ga_{0.99}Ge_{4.9}O_{16}$: $0.03Gd^{3+}$: $0.01Cr^{3+}$: $0.1Sn^{4+}$
- ◇ $La_{2.97}Ga_{0.99}Ge_{4.85}O_{16}$: $0.03Gd^{3+}$: $0.01Cr^{3+}$: $0.15Sn^{4+}$

PHOSPHOR, METHOD FOR PREPARING PHOSPHOR, OPTOELECTRONIC COMPONENT, AND METHOD FOR PRODUCING OPTOELECTRONIC COMPONENT

TECHNICAL FIELD

The present application relates to a phosphor, a method for preparing the phosphor, an optoelectronic component, and a method for producing the optoelectronic component, in particular, it relates to a phosphor having a high radiant flux and having a wide emission spectral wavelength in a red visible light and near-infrared regions, a method for preparing the phosphor, an optoelectronic component provided with the phosphor, and a process for producing the optoelectronic component.

BACKGROUND

Visible light is a part of the electromagnetic spectrum that can be perceived by human eyes. Infrared light is an electromagnetic wave (light) having a longer wavelength than the visible light. Studies have shown that infrared light can "penetrate" into human skin and is absorbable by the epidermis, dermis and subcutaneous tissue. At the same time, some spectrums absorbable by human organs falls within a visible range of electromagnetic spectrum, however, the reflected spectrum is a broadband reflection spectrum, which is within ranges of near-infrared light and red visible light. For instance, in a human brain, protein and oxyhemoglobin have an absorption spectrum and a reflection spectrum of 450 nm-600 nm and 700 nm-900 nm, respectively.

Therefore, organs can be detected according to the light spectrum absorbed or reflected by the different organs of the human body, for instance, for analyzing haemoglobin content, oxygen saturation, scattering lipid content, etc., and an extension has been made to the field of food or polymer component detection. In recent years, an optoelectronic component capable of generating a wide infrared emission spectrum has been widely used in security camera, iris/facial recognition, virtual reality, gaming notebook and light detection and ranging (LIDAR) technologies.

However, the infrared light emitted by optoelectronic components on the current market has disadvantages such as narrow emission spectrum, low radiant flux and the like, which cannot meet application requirements of the above medical component detection, intelligent technology and the like.

A luminescent material is a material that releases energy in the form of emitted light due to excitation from excitation light source. Currently, the luminescent material that is most studied and well-developed is mainly phosphor, especially phosphor excited by the blue chip for generating white LEDs, and the research has a focus on how to obtain emitted light (or called a secondary radiation) of a narrower wavelength range. The principle of white LED applies to the infrared phosphors converted LED also and hence it possesses advantages like low power consumption, compact, high lifetime and cheaper as compared to traditional light sources. In recent research, it is also reported that the use of phosphor is expanded to the security of anti-counterfeit and marker identification. For instance, it is reported that a study is made on the possibility of $La_3Ga_5GeO_{14}$: $Cr^{3+}$ for the applications of persistent luminescence, which mainly utilizing the phosphorescence property of the phosphors, continuous emission of light for a long time after excitation is ceased off. However, there is no report about the phosphor which can produce wide red visible light and near-infrared spectrums when excited by blue visible light, purple visible light or ultraviolet light and has a high radiant flux, let alone its application in the optoelectronic component.

SUMMARY

In view of the above drawbacks in the prior art, the present application provides a phosphor capable of emitting near-infrared light and red visible light when excited by blue visible light, purple visible light or ultraviolet light and having a wide emission spectrum and a high radiant flux.

The present application further provides a method for preparing the above phosphor, the phosphor prepared by the method can emit near-infrared light and red visible light when excited by blue visible light, purple visible light or ultraviolet light, and has a wide emission spectrum and a high radiant flux.

The present application provides an optoelectronic component, which can use a conversion unit provided with the above phosphor to convert blue visible light, purple visible light or ultraviolet light emitted from a semiconductor chip into the near-infrared light and red visible light. The optoelectronic component has a wide emission spectrum and a high radiant flux in the ranges of near-infrared light and red visible light.

The present application further provides a method for producing an optoelectronic component, where the method has a characteristic of simple process and can produce an optoelectronic component that converts blue visible light, purple visible light or ultraviolet light into the near-infrared light and red visible light.

To achieve the above purpose, the present application provides a phosphor having the following general formula:

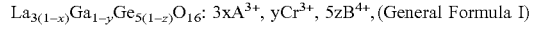

$La_{3(1-x)}Ga_{1-y}Ge_{5(1-z)}O_{16}$: $3xA^{3+}$, $yCr^{3+}$, $5zB^{4+}$, (General Formula I)

where x, y, and z do not equal to 0 simultaneously; A represents at least one of Gd and Yb; and B represents at least one of Sn, Nb, and Ta.

The phosphor is composed of a host material acting as a matrix and a dopant (or referred to as a luminescent center) acting as an activator, sometimes a sensitizer needs to be incorporated. The activator and the sensitizer replacing the ions in the original site of the matrix lattice.

Specifically, in the phosphor represented by the General Formula I, $0 \leq x \leq 0.5$, $0 \leq y \leq 0.5$, $0 \leq z \leq 0.5$, and x, y, and z do not equal to 0 simultaneously. In a specific implementation of the present application, usually $0 \leq 3x \leq 0.3$, $0 \leq y \leq 0.2$, $0 \leq 5z \leq 0.2$, and x, y and z do not equal to 0 simultaneously.

In a specific implementation of the present application, the phosphor has the following general formula:

$La_3Ga_{1-y}Ge_5O_{16}$: $yCr^{3+}$, (General Formula II)

where $0 < y \leq 0.2$.

In the phosphor represented by the General Formula II, $La_3Ga_{1-y}Ge_5O_{16}$ is a host material of the matrix, and $Cr^{3+}$ is an activator. Adjusting the doping concentration of $Cr^{3+}$, the emission spectrum of the phosphor is maintained in a near-infrared region and a red visible region, but the radiant flux changes accordingly; therefore, the doping concentration of $Cr^{3+}$ is generally controlled to 0.5%-20%, it means, $0.005 \leq y \leq 0.2$. In a specific implementation of the present application, the doping concentration of $Cr^{3+}$ is usually controlled to 3.0%-11%, it means, $0.035 \leq y \leq 0.11$, so that the phosphor has a high radiant flux.

In another implementation of the present application, the phosphor has the following general formula:

$$La_{3(1-x)}Ga_{1-y}Ge_5O_{16}: 3xA^{3+}, yCr^{3+}, \quad \text{(General Formula III)}$$

where $0 \leq 3x \leq 0.3$, $0 \leq y \leq 0.2$, and x and y do not equal to 0 simultaneously, for instance, $0 < 3x \leq 0.3$ and $0 < y \leq 0.2$; A represents at least one of Gd and Yb In the phosphor represented by the General Formula III, the doping concentration of $Cr^{3+}$ is fixed. For instance, the doping concentration of $Cr^{3+}$ is controlled to less than 10%, that is, $0 < y \leq 0.1$; changing the doping concentration of $A^{3+}$, the emission spectrum of the phosphor is maintained at the near-infrared region and the red visible region, but the radiant flux changes accordingly, therefore, the doping concentration of $A^{3+}$ is generally controlled to 0.1%-10%, that is, $0.003 \leq 3x \leq 0.3$. In a specific implementation of the present application, the doping concentration of $A^{3+}$ is generally controlled to 0.5%-5%, that is, $0.015 \leq 3x \leq 0.15$, so that the phosphor has a high radiant flux.

In still another implementation of the present application, in the phosphor having the General Formula I ($La_{3(1-x)}Ga_{1-y}Ge_{5(1-z)}O_{16}$: $3xA^{3+}$, $yCr^{3+}$, $5zB^{4+}$), $0 < 3x \leq 0.3$, $0 < y \leq 0.2$, $0 < 5z \leq 0.2$; A represents at least one of Gd and Yb; and B represents at least one of Sn, Nb and Ta.

In the phosphor represented by the General Formula I, the doping concentrations of $Cr^{3+}$ and $A^{3+}$ are fixed. For instance, it is controlled that $0 < 3x \leq 0.1$, $0y \leq 0.1$; changing the doping concentration of $B^{4+}$, the emission spectrum of the phosphor is maintained in the near-infrared region and the red visible region, but the radiant flux changes accordingly, therefore, the doping concentration of $B^{4+}$ is generally controlled to 0.5%-4%, that is, $0.025 \leq 5z \leq 0.2$. In a specific implementation process of the present application, the doping concentration of $B^{4+}$ is generally controlled to 0.5%-3%, that is, $0.025 \leq 5z \leq 0.15$, so that the phosphor has a high radiant flux.

Specifically, the above phosphor satisfies at least one of the following three conditions based on the composition of $La_3GaGe_5O_{16}$:

$Cr^{3+}$ replaces part of $Ga^{3+}$;

$A^{3+}$ replaces part of $La^{3+}$;

$B^{4+}$ replaces part of $Ge^{4+}$.

For instance, for the phosphor represented by the General Formula II, the doped $Cr^{3+}$ replaces part of $Ga^{3+}$ in the matrix $La_3GaGe_5O_{16}$, or the incorporation of $Cr^{3+}$ to replace $Ga^{3+}$ on the original site of the matrix lattice.

When excited by blue visible light, purple visible light or ultraviolet light acting as a primary radiation, the above phosphor emits a secondary radiation within the ranges of the red visible light spectrum and the near-infrared spectrum and has a wide emission spectrum. In particular, the above phosphor has an emission spectrum of 650 -1500 nm, especially 650-1050 nm, when excited by excitation light having a wavelength of 400-500 nm, especially a wavelength of 450 nm or 460 nm.

Moreover, the phosphor has a high radiant flux within the range of the emission spectrum described above, and radiant flux of the light emitted by the phosphor is 4-70 mW.

In still another implementation of the present application, a phosphor having the following general formula is provided:

$$La_3Ga_{5(1-x)}Ge_{1-y}O_{14}: 5xCr^{3+}, ySn^{4+}, \quad \text{(General Formula IV)}$$

where $0 < x \leq 0.1$, $0 \leq y \leq 0.9$.

In the phosphor represented by the General Formula IV, $La_3Ga_{5(1-x)}Ge_{1-y}O_{14}$ is used as a host material of the matrix, $Cr^{3+}$ is used as an activator (or called a luminescent center), and $Sn^{4+}$ is used as a sensitizer.

When excited by blue visible light, purple visible light or ultraviolet light acting as a primary radiation, the phosphor represented by the General Formula IV emits a secondary radiation within the ranges of the red visible light spectrum and the near-infrared spectrum and has a wide emission spectrum. Specifically, when excited by excitation light having a wavelength of 400-500 nm, especially a wavelength of 450 nm or 460 nm, the phosphor represented by the General Formula IV has an emission spectrum of 650-1500 nm, especially 650-1050 nm.

Specifically, based on the $La_3Ga_5GeO_{14}$ composition, in the phosphor represented by the General Formula IV, $Cr^{3+}$ and $Sn^{4+}$ partially replace the part of metal elements in the host material.

All of the above phosphors can be prepared by a conventional high-temperature solid-state reaction method in the art. Specifically, raw materials are stoichiometrically weighted according to the above general formula and mixed evenly in an agate mortar and then sintered at a certain temperature in the furnace, for instance, at a temperature of 1200-1500° C. to obtain a target product.

The present application further provides a method for preparing the above-described phosphor, including steps of preparing and mixing raw materials for providing elements in the general formula according to the general formula of the luminescent material and then sintering at a temperature of 1200-1500° C. to obtain a target phosphor.

Specifically, the raw materials are accurately weighed according to a designed formula, placed in an agate mortar to grind for evenly mixing, and then the mixture is sintered in an air atmosphere, generally, the temperature is controlled to 1250-1350° C. to sinter for about 5-6 hours, then the phosphor can be obtained.

The raw materials for preparing the phosphor described above may be specifically selected from oxide or carbonate containing the elements in the determined general formula or other compounds capable of providing corresponding metal elements. For instance, if the phosphor to be prepared has a molecular formula of $La_3Ga_{0.09}Ge_5O_{16}:0.01Cr^{3+}$, then a weighted calculation may be performed for the desired raw materials $La_2O_3$, $Ga_2O_3$, $Cr_2O_3$ and $GeO_2$ according to a stoichiometric ratio in the molecular formula, and the weights of the raw materials are finally determined.

The present application provides an optoelectronic component including:

a semiconductor chip for emitting excitation light during operation of the optoelectronic component; and a conversion unit provided with the above-described phosphor for converting the excitation light into emitted light.

Specifically, the excitation light acting as the primary radiation has a wavelength of 400-500 nm, especially a wavelength of 450 nm or 460 nm; the emitted light acting as the secondary radiation has a wavelength of 600-1500 nm, especially 600-1100 nm, and more particularly 650-1050 nm.

The above semiconductor chip is not particularly limited in the present application, as long as it can emit the primary radiation of the above wavelength during operation, such as a blue, purple or ultraviolet LED chip or laser chip which has been commercialized, especially a blue LED chip of 400-500 nm, more particularly a blue LED chip of 450 nm or a blue LED chip of 460 nm. In a specific implementation of the present application, a blue LED chip having an emission wavelength of 450-452.5 nm is used.

The above-described optoelectronic component is not particularly limited in the present application with regard to its specific form, as long as it can achieve the above functions. For instance, it may present in a form of an LED device including at least a blue, purple or ultraviolet LED chip for generating a primary radiation and a conversion unit for converting the primary radiation into a secondary radiation. The conversion unit is disposed in an optical path of the primary radiation and contains or is provided with the above-described phosphor.

The present application does not specifically limit how to obtain the conversion unit according to the above phosphor. It can be a common method in the field of optoelectronic components, especially LED devices, as long as a cooperation with the LED chip may be achieved to realize the conversion from the primary radiation to the secondary radiation. For instance, the phosphor is dispersed in a transparent epoxy resin in a certain ratio to obtain a conversion unit dispersed outside the LED chip.

The present application further provides a method for producing an optoelectronic component, including steps of:

producing a conversion unit on which the above phosphor is provided;

mounting the produced conversion unit on a semiconductor chip, where the semiconductor chip is used to generate excitation light during operation of the optoelectronic component.

The closer the phosphor is to the semiconductor chip, the higher or the lower its concentration is.

The closer the phosphor is to the semiconductor chip, the higher or the lower its concentration appears in a gradient manner.

The phosphor may be in direct or indirect contact with the semiconductor chip.

The phosphor may be a quantum dot phosphor.

Particles of the phosphor may be covered with at least one layer of oxide at its periphery, such as silicon dioxide.

Further, the method for producing the optoelectronic component described above may further include step for preparing the above-described phosphor: preparing and mixing the raw materials for providing elements in the general formula according to the general formula of the phosphor, and then sintering at a temperature of 1200-1500° C., for instance, sintering for about 5-6 hours at a temperature of about 1250-1350° C. to obtain the desired phosphor.

For the phosphor provided in the present application, its emission spectrum is within the red visible light and near-infrared light when excited by blue visible light, purple visible light or ultraviolet light; and it has a wide emission spectrum and a high radiant flux. Therefore, it can be used in optoelectronic components such as LEDs and laser devices to meet requirements of current medical testing, food composition analysis, security camera, iris/facial recognition, virtual reality, gaming notebook and light detection and ranging applications.

The preparing method of the above phosphor provided in the present application has a characteristic of the simple process and is convenient for practical generalization and large-scale application.

The optoelectronic component provided in the present application can use a conversion unit provided with the above-described phosphor to convert blue, purple or ultraviolet light emitted from the semiconductor chip into near-infrared light and red visible light in order, and it has a wide emission spectrum and a high radiation flux in the ranges of near-infrared light and red visible light, so as to meet requirements of current medical testing, food composition analysis, security cameras, iris/facial recognition, virtual reality, gaming notebook and light detection and ranging applications.

Moreover, the optoelectronic component has a characteristic of the simple structure, can be improved and obtained on the basis of the existing optoelectronic component, and has an advantage of low manufacturing cost.

The method for producing the optoelectronic component provided in the present application has a characteristic of simple process and can be processed on the basis of the existing device component, further facilitating the generalization of the above-described optoelectronic component.

BRIEF DESCRIPTION OF DRAWING(S)

DETAILED DESCRIPTION

In order to describe objectives, technical solutions and advantages of examples of the present application more clearly, the technical solutions in the examples of the present application will be described hereunder clearly and completely with reference to the accompanying drawings in the examples of the present application. The described examples are only a part of examples, rather than all examples of the present application. All other examples obtained by those skilled in the art based on the embodiments of the present application without any creative effort should fall within the scope of the present application.

The raw materials used in the following examples: $La_2O_3$, $Ga_2O_3$ and $Cr_2O_3$ have a purity of 99.9% respectively, all of which are commercially available from Merck; $GeO_2$ has a purity of 99.9%, which is commercially available from Aldrich; $Gd_2O_3$, $Yb_2O_3$ and $SnO_2$ have a purity of 99.9% respectively, all of which are commercially available from Sigma Aldrich.

The tubular and muffle furnace is commercially available from Eurotherm. The X-ray diffraction spectrum of the sample powders of the phosphor is measured by an X-ray diffractometer commercially available from BRUKER AXS with a model number of Desktop Bruker D2 PHASER A26-X1-A2B0B2A (Serial No. 205888). The photoluminescence emission spectrum of the sample powders of the phosphor is measured by Gemini 180 and iR320 commercially available from Horiba (Jobin Yvon).

EXAMPLE 1

The present example provides a set of phosphors having a general formula of $La_3Ga_{1-y}Ge_5O_{16}$: $yCr^{3+}$, where $0<y\leq 0.2$, the chemical formulas of the set of phosphors are as follows:

$La_3Ga_{0.995}Ge_5O_{16}$: $0.005Cr^{3+}$ $La_3Ga_{0.99}Ge_5O_{16}$: $0.01Cr^{3+}$ $La_3Ga_{0.97}Ge_5O_{16}$: $0.03Cr^{3+}$ $La_3Ga_{0.95}Ge_5O_{16}$: $0.05Cr^{3+}$ $La_3Ga_{0.93}Ge_5O_{16}$: $0.07Cr^{3+}$ $La_3Ga_{0.91}Ge_5O_{16}$: $0.09Cr^{3+}$ $La_3Ga_{0.89}Ge_5O_{16}$: $0.11Cr^{3+}$ $La_3Ga_{0.87}Ge_5O_{16}$: $0.13Cr^{3+}$

The preparing method of the set of phosphors is as follows: according to stoichiometric ratios in the molecular formulae of the phosphors, accurately weighing the raw materials $La_2O_3$, $Ga_2O_3$, $GeO_2$ and $Cr_2O_3$; placing the weighed raw materials in an agate mortar to grind for evenly mixing; then transferring the resulting mixture to an alumina crucible; placing in a muffle furnace and sintering in an air atmosphere at a temperature of about 1250-1300° C. for about 5-6 hours; and after cooling with the furnace, grinding into powders to obtain a target phosphor.

Figure 1:
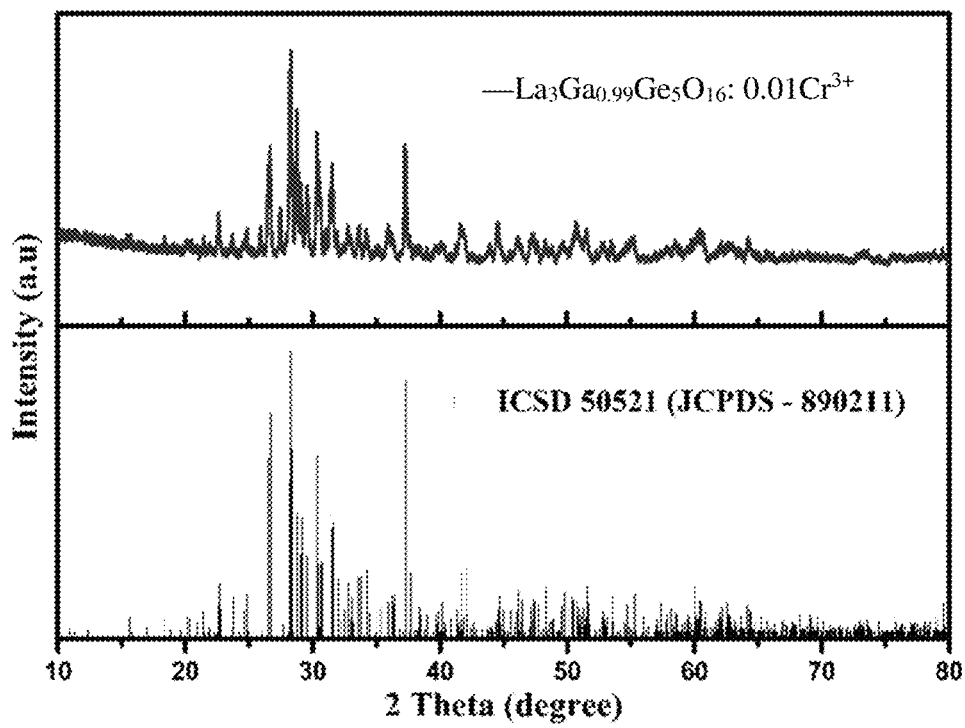
FIG. 1 is the X-ray diffraction spectrum of the phosphor $La_3Ga_{0.99}Ge_5O_{16}$: $0.01Cr^{3+}$ according to Example 1.
Figure 2:
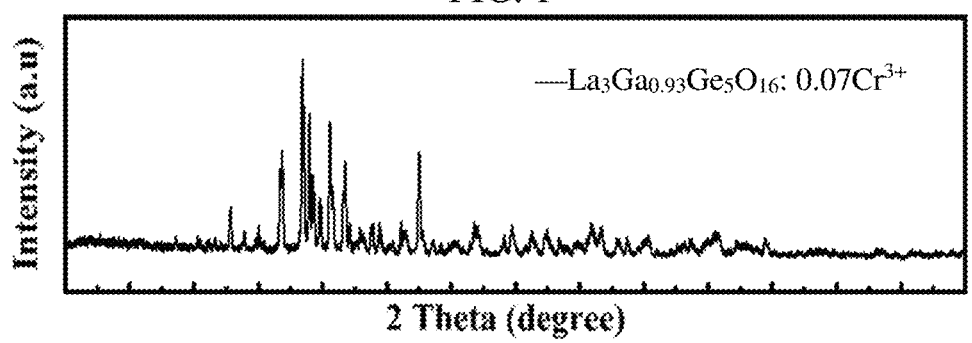
FIG. 2 is the X-ray diffraction spectrum of the phosphor $La_3Ga_{0.93}Ge_5O_{16}$: $0.07Cr^{3+}$ according to Example 1.

FIG. 1 and FIG. 2 shows the X-ray diffraction spectrums of $La_3Ga_{0.99}Ge_5O_{16}$: $0.01Cr^{3+}$ and $La_3Ga_{0.93}Ge_5O_{16}$: $0.07Cr^{3+}$, respectively. X-ray diffraction spectrums of other phosphors in the set are similar to those in FIG. 1-FIG. 2. As shown in FIG. 1 and FIG. 2, the X-ray diffraction spectrum of the above two phosphors are respectively compared with a standard X-ray diffraction spectrum. All the diffraction peaks of the two phosphors are consistent with a standard spectrum JCPDS 890211 (ICSD-50521) and no impurity peak is observed, indicating that the incorporation of $Cr^{3+}$ incurred no changes in the crystal structure, that is, the activator $Cr^{3+}$ successfully entered into the crystal lattice. Further, the crystals of $La_3Ga_{0.99}Ge_5O_{16}$: $0.01Cr^{3+}$ and $La_3Ga_{0.93}Ge_5O_{16}$: $0.07Cr^{3+}$ belong to a triclinic system, and a space group is P-1(2).

Figure 3:
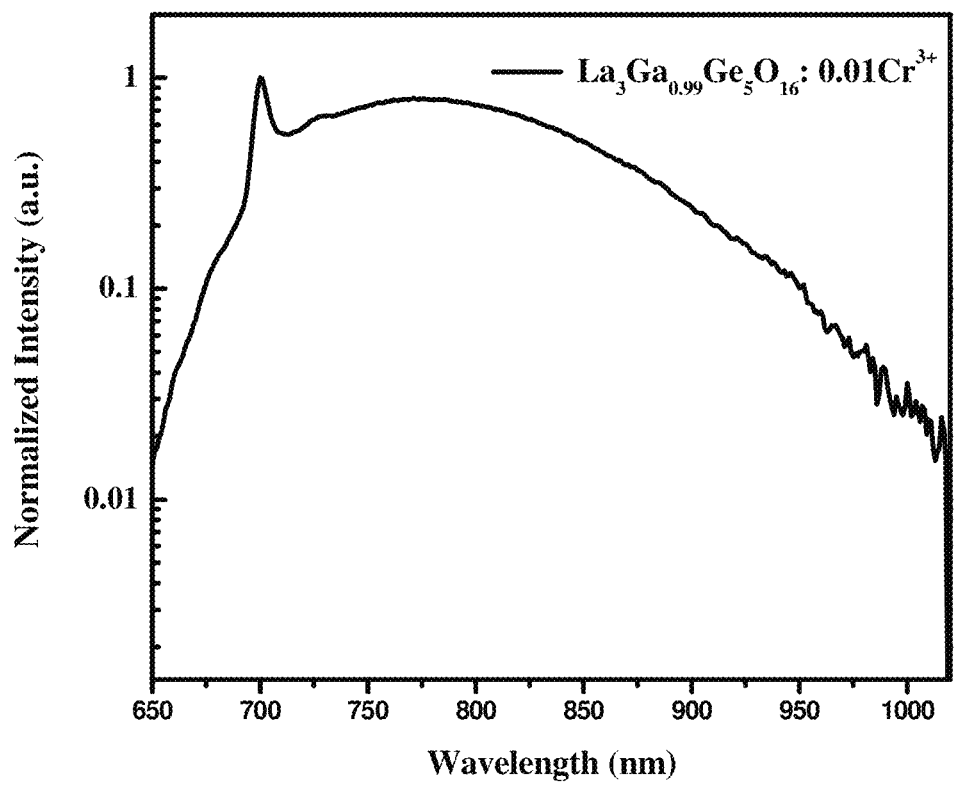
FIG. 3 is the photoluminescence emission spectrum (the excitation light has a wavelength of 460 nm) of the phosphor $La_3Ga_{0.99}Ge_5O_{16}$: $0.01Cr^{3+}$ according to Example 1.
Figure 4:
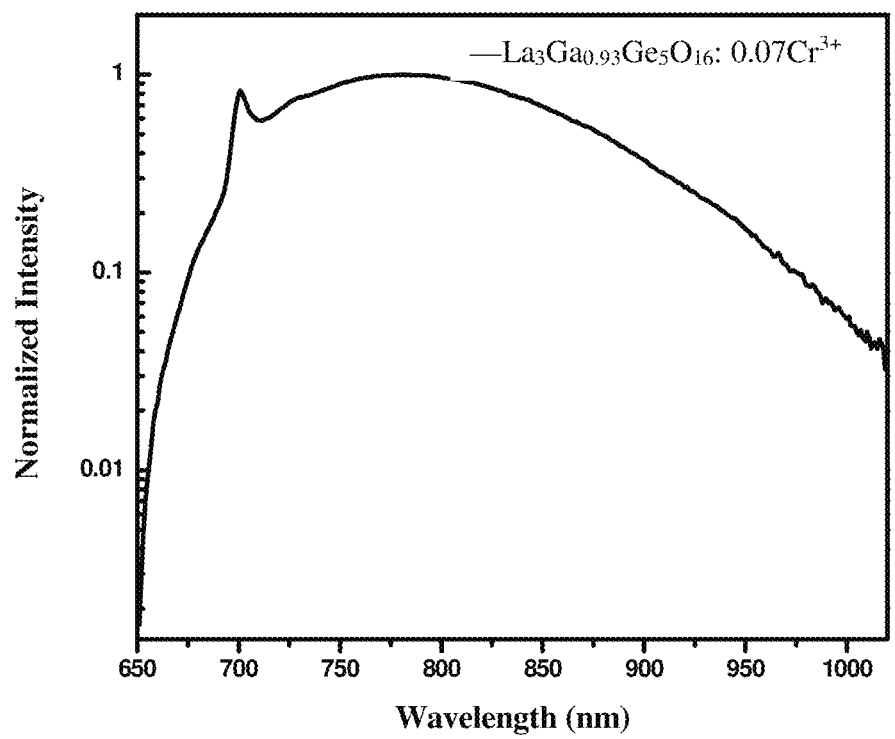
FIG. 4 is the photoluminescence emission spectrum (the excitation light has a wavelength of 450 nm) of the phosphor $La_3Ga_{0.93}Ge_5O_{16}$: $0.07Cr^{3+}$ according to Example 1.

FIG. 3 and FIG. 4 shows the photoluminescence emission spectrums of $La_3Ga_{0.99}Ge_5O_{16}$: $0.01Cr^{3+}$ and $La_3Ga_{0.93}Ge_5O_{16}$: $0.07Cr^{3+}$, respectively. The photoluminescence emission spectrums of other phosphors are similar to those in FIG. 3 and FIG. 4. As shown in FIG. 3 and FIG. 4, when excited by excitation light of 460 nm or 450 nm, the emission spectrums of $La_3Ga_{0.99}Ge_5O_{16}$: $0.01Cr^{3+}$ and $La_3Ga_{0.93}Ge_5O_{16}$: $0.07Cr^{3+}$ cover the spectral range of 600-1100 nm, especially a spectral range of 650-1050 nm.

Based on the above test and characterization results, considering the ionic radius and valence state, it can be determined that, in the set of phosphors, the incorporation of $Cr^{3+}$ replaces the lattice position of $Ga^{3+}$ in the matrix.

EXAMPLE 2

The present example provides a phosphor having a molecular formula of $La_{2.97}Ga_{0.99}Ge_5O_{16}$: $0.03Gd^{3+}$, $0.01Cr^{3+}$, the preparing method of the phosphor is as follows:

According to a stoichiometric ratio in the molecular formula of the phosphor, accurately weighing the raw materials $La_2O_3$, $Ga_2O_3$, $GeO_2$, $Gd_2O_3$ and $Cr_2O_3$, and placing the weighed raw materials into an agate mortar to grind for evenly mixing; then transferring the mixture to an alumina crucible; placing in a muffle furnace and sintering in an air atmosphere; controlling the temperature at about 1250° C. to sinter for about 6 hours; and after cooling in the furnace, grinding into powders to obtain the phosphor.

Figure 5:
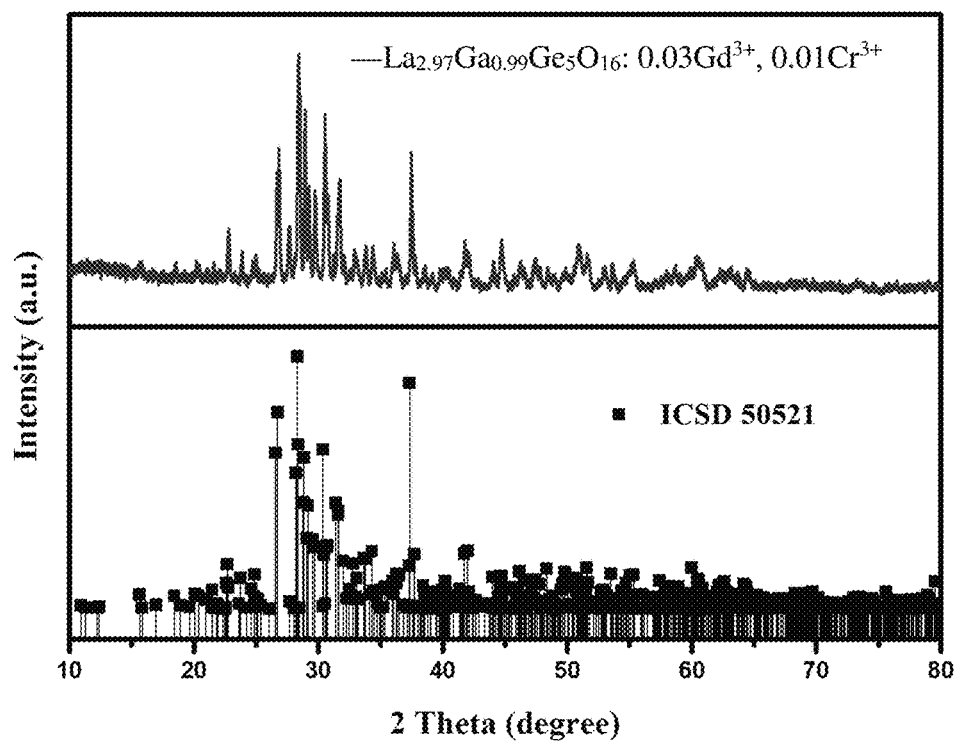
FIG. 5 is the X-ray diffraction spectrum of the phosphor $La_{2.97}Ga_{0.99}Ge_5O_{16}$: $0.03Gd^{3+}$, $0.01Cr^{3+}$ according to Example 2.

As shown in FIG. 5, the X-ray diffraction spectrum of the phosphor is compared with the standard X-ray diffraction spectrum. All the diffraction peaks of the phosphor are consistent with the standard spectrum JCPDS 890211 (ICSD-50521) and no impurity peak is detected, indicating that the activator $Cr^{3+}$ and the sensitizer $Gd^{3+}$ successfully entered into the crystal lattice. Further, the crystal of the phosphor belongs to the triclinic system, and the space group is P-1 (2).

Figure 6:
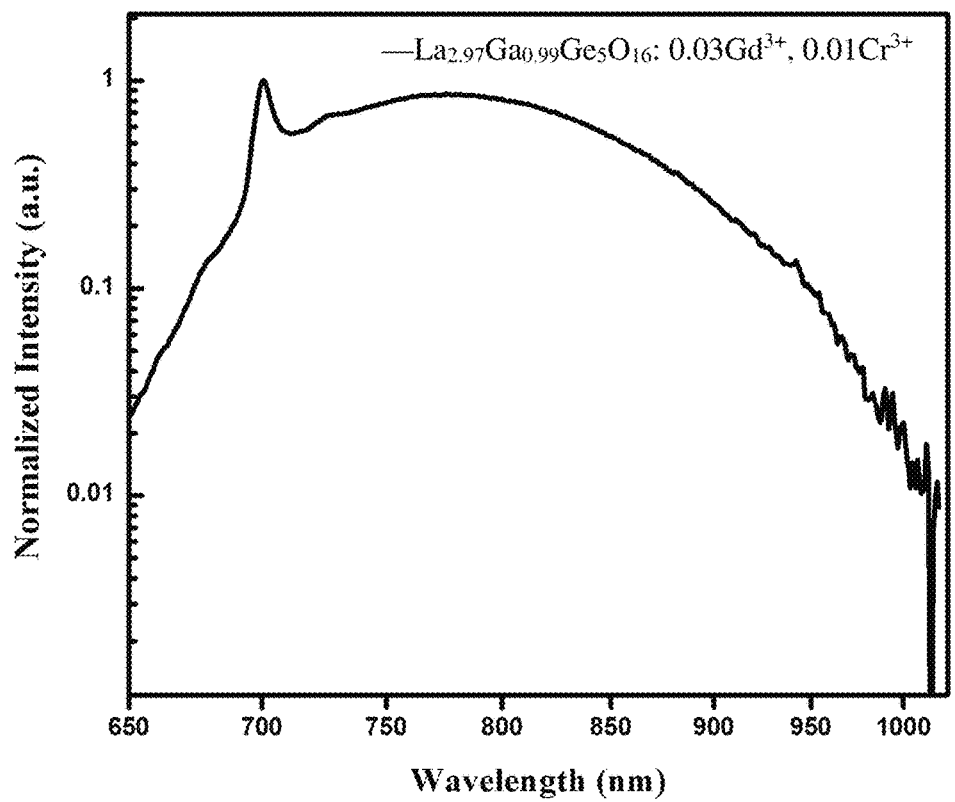
FIG. 6 is the photoluminescence emission spectrum (the excitation light has a wavelength of 460 nm) of the phosphor $La_{2.97}Ga_{0.99}Ge_5O_{16}$: $0.03Gd^{3+}$, $0.01Cr^{3+}$ according to Example 2.

As shown in FIG. 6, when excited by the excitation light of 460 nm, the emission spectrum of $La_{2.97}G_{0.99}Ge_5O_{16}$: $0.03Gd^{3+}$, $0.01Cr^{3+}$ covers a spectral range of 600-1100 nm, especially a spectral range of 650-1050 nm.

Based on the above test and characterization results, considering the ionic radius and valence state, it can be determined that, in the phosphor, the incorporation of $Cr^{3+}$ replaces the lattice position of $Ga^{3+}$ in the matrix; similarly, the co-doped $Gd^{3+}$ replaces $La^{3+}$ on the original site of the matrix lattice.

EXAMPLE 3

The present example provides a phosphor having a molecular formula of $La_{2.97}Ga_{0.99}Ge_5O_{16}$: $0.03Yb^{3+}$, $0.01Cr^{3+}$, the preparing method of the phosphor is as follows:

According to a stoichiometric ratio in the molecular formula of the phosphor, accurately weighing the raw materials $La_2O_3$, $Ga_2O_3$, $GeO_2$, $Yb_2O_3$ and $Cr_2O$, and placing the weighed raw materials into an agate mortar to grind for evenly mixing; then transferring the mixture to an alumina crucible; placing in a muffle furnace and sintering in an air atmosphere; controlling the temperature at about 1250° C. to sinter for about 6 hours; and after cooling with the furnace, grinding into powders to obtain the phosphor.

Figure 7:
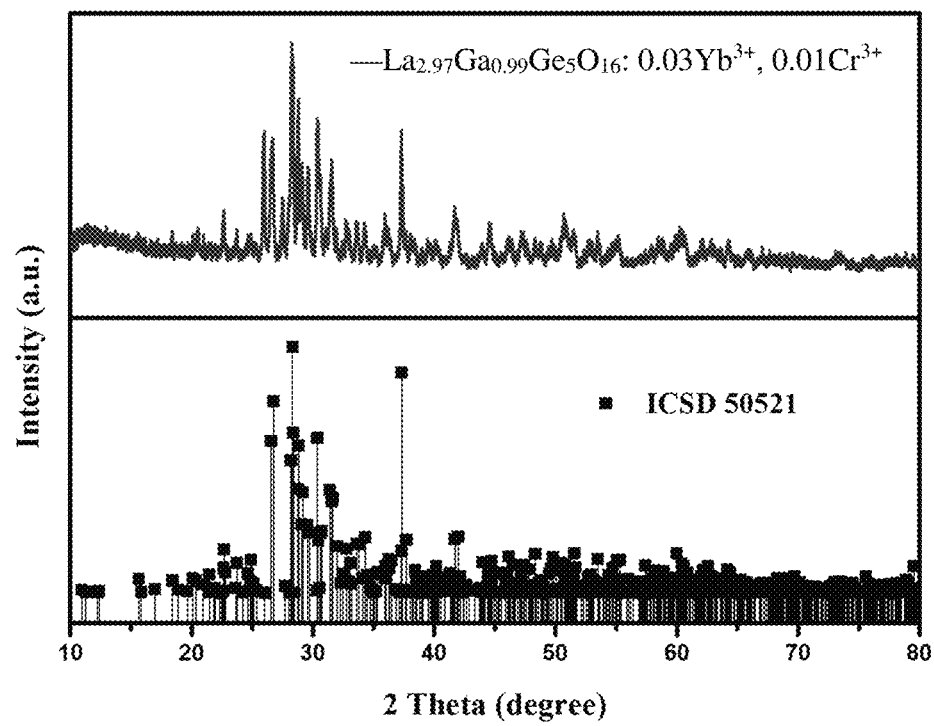
FIG. 7 is the X-ray diffraction spectrum of the phosphor $La_{2.97}Ga_{0.99}Ge_5O_{16}$: $0.03Yb^{3+}$, $0.01Cr^{3+}$ according to Example 3.

As shown in FIG. 7, the X-ray diffraction spectrum of the phosphor was compared with a standard X-ray diffraction spectrum. All the diffraction peaks of the phosphor are consistent with the standard spectrum JCPDS 890211 (ICSD-50521) and no impurity peak is detected, indicating that the activator $Cr^{3+}$ and the sensitizer $Yb^{3+}$ successfully entered into the crystal lattice. Further, the crystal of the phosphor belongs to the triclinic system, and the space group is P-1 (2).

Figure 8:
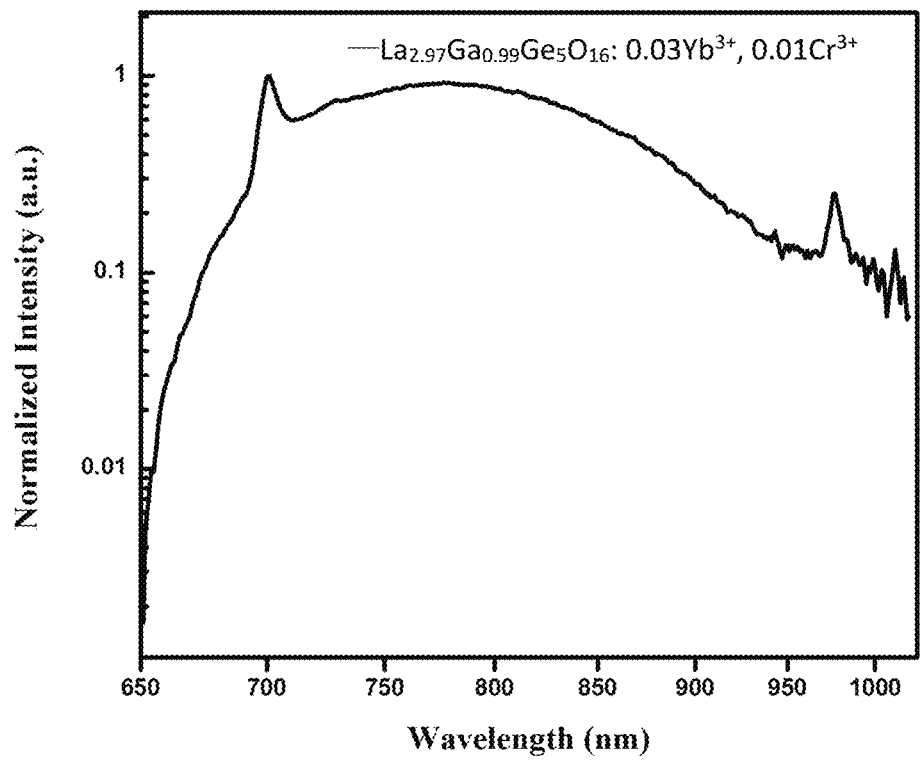
FIG. 8 is the photoluminescence emission spectrum (the excitation light has a wavelength of 460 nm) of the phosphor $La_{2.97}Ga_{0.99}Ge_5O_{16}$: $0.03Yb^{3+}$, $0.01Cr^{3+}$ according to Example 3.

As shown in FIG. 8, when excited by the excitation light of 460 nm, the emission spectrum of the phosphor $La_{2.97}Ga_{0.99}Ge_5O_{16}$: $0.03Yb^{3+}$, $0.01Cr^{3+}$ covers a spectral range of 600-1100 nm, especially a spectral range of 650-1050 nm.

Based on the above test and characterization results, considering the ionic radius and valence state, it can be determined that $Cr^{3+}$ replaces $Ga^{3+}$ on the original site in the matrix lattice. Similarly, the co-doped $Yb^{3+}$ replaces $La^{3+}$ on the original site in the matrix lattice.

EXAMPLE 4

The present example provides a set of phosphors having a general formula of $La_{3(1-x)}Ga_{1-y}Ge_5O_{16}$: $3xA^{3+}$, $yCr^{3+}$, where $0<3x+0.3$, $y=0.07$, and A represents Gd, the chemical formulae of the set of phosphors are as follows, and reference may be made to Example 2 for the corresponding preparing method:

$La_{2.985}Ga_{0.93}Ge_5O_{16}$: $0.015Gd^{3+}$, $0.07Cr^{3+}$ $La_{2.97}Ga_{0.93}Ge_5O_{16}$: $0.03Gd^{3+}$, $0.07Cr^{3+}$ $La_{2.955}Ga_{0.93}Ge_5O_{16}$: $0.045Gd^{3+}$, $0.07Cr^{3+}$ $La_{2.94}Ga_{0.93}Ge_5O_{16}$: $0.06Gd^{3+}$, $0.07Cr^{3+}$ $La_{2.91}Ga_{0.93}Ge_5O_{16}$: $0.09Gd^{3+}$, $0.07Cr^{3+}$ $La_{2.85}Ga_{0.93}Ge_5O_{16}$: $0.15Gd^{3+}$, $0.07Cr^{3+}$ $La_{2.79}Ga_{0.93}Ge_5O_{16}$: $0.21Gd^{3+}$, $0.07Cr^{3+}$

Figure 9:
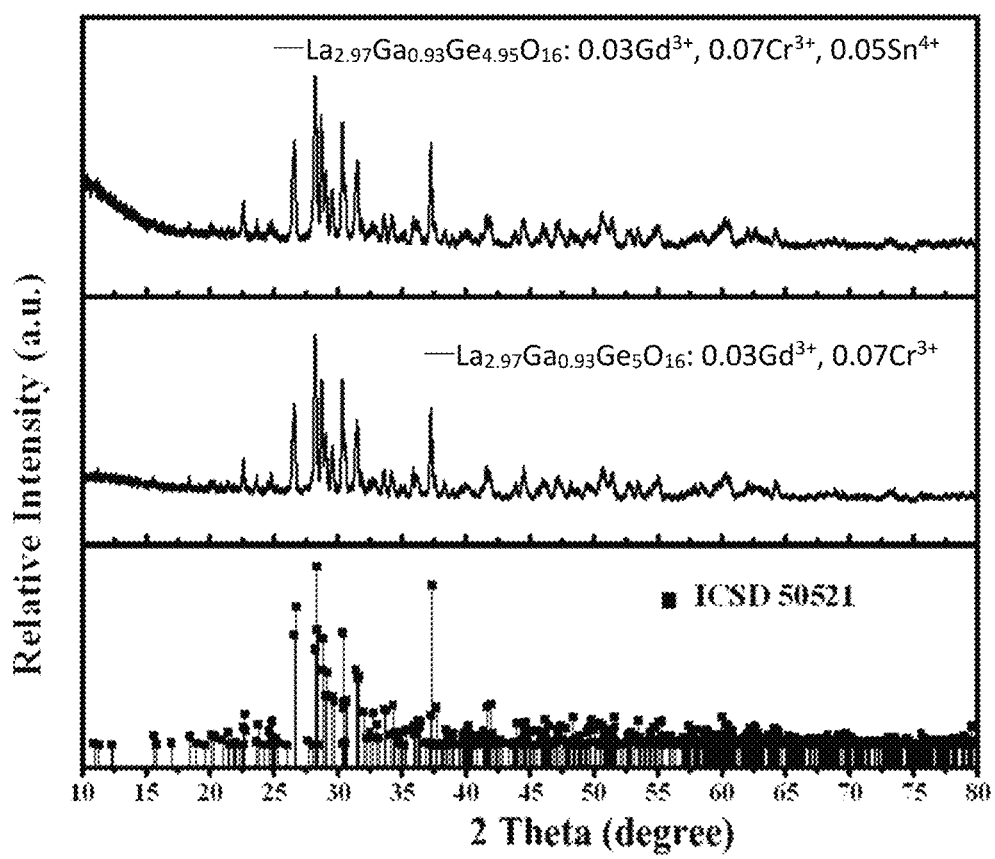
FIG. 9 is the X-ray diffraction spectrum of the phosphors according to Examples 4-5.

FIG. 9 is the X-ray diffraction spectrum of the phosphor $La_{2.97}Ga_{0.93}Ge_5O_{16}$: $0.03Gd^{3+}$, $0.07Cr^{3+}$, and XRD diffraction spectrums of other phosphors are similar to those in FIG. 9. As shown in FIG. 9, the X-ray diffraction spectrums of the phosphors are compared with the standard X-ray diffraction spectrum. All the diffraction peaks of the phosphors are consistent with the standard spectrum JCPDS 890211 (ICSD-50521), and no impurity peak is observed, indicating that the activator $Cr^{3+}$ and the $Gd^{3+}$ successfully entered into the crystal lattice. Further, the crystals of the set of phosphors belong to the triclinic system, and the space group is P-1 (2).

Figure 10:
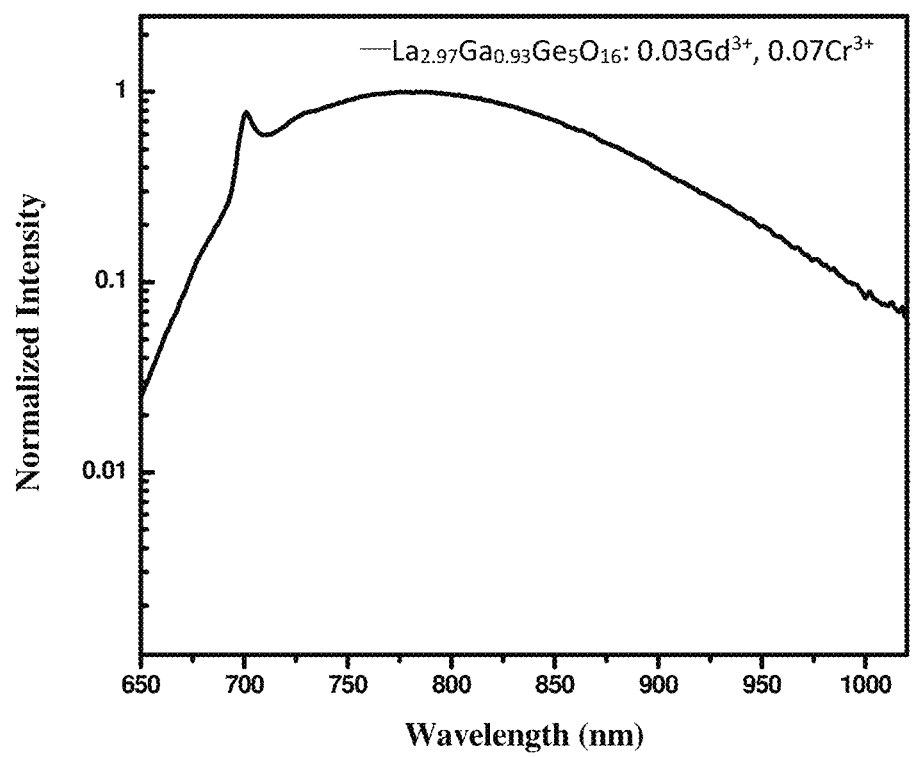
FIG. 10 is the photoluminescence emission spectrum (the excitation light has a wavelength of 450 nm) of the phosphor $La_{2.97}Ga_{0.93}Ge_5O_{16}$: $0.03Gd^{3+}$, $0.07Cr^{3+}$ according to Example 4.

FIG. 10 is the photoluminescence emission spectrum of the phosphor $La_{2.97}Ga_{0.93}Ge_5O_{16}$: $0.03Gd^{3+}$, $0.07Cr^{3+}$. Photoluminescence emission spectrums of other phosphors are similar to those in FIG. 10. As shown in FIG. 10, when excited by the excitation light of 450 nm, the emission spectrum of the phosphor covers a range of 600-1100 nm, especially a range of 650-1050 nm.

Based on the above test and characterization results, considering the ionic radius and valence state, it can be determined that the incorporation of $Cr^{3+}$ replaces $Ga^{3+}$ on the original site in the matrix lattice. Similarly, the incorporation of co-doped $Gd^{3+}$ replaces $La^{3+}$ on the original site in the matrix lattice.

EXAMPLE 5

The present example provides a phosphor having a molecular formula of $La_{2.97}Ga_{0.93}Ge_{4.95}O_{16}$: $0.03Gd^{3+}$, $0.07Cr^{3+}$, $0.05Sn^{4+}$. The preparing method of the phosphor is as follows:

According to a stoichiometric ratio in the molecular formula of the phosphor, accurately weighing the raw materials $La_2O_3$, $Ga_2O_3$, $GeO_2$, $Gd_2O_3$, $Cr_2O_3$ and $SnO_2$, and placing the weighed raw materials into an agate mortar to grind for evenly mixing; then transferring the resulting mixture to an alumina crucible; placing in a muffle furnace and sintering in an air atmosphere; controlling the temperature at about 1250° C. to sinter for about 5 hours; and after cooling with the furnace, grinding into powders to obtain the phosphor.

As shown in FIG. 9, the X-ray diffraction spectrums of the phosphors are compared with the standard X-ray diffraction spectrum. All the diffraction peaks of the phosphor are consistent with the standard spectrum JCPDS 890211 (ICSD-50521) and no impurity peak is observed, indicating that the activator $Cr^{3+}$, the sensitizers $Gd^{3+}$ and $Sn^{4+}$ successfully entered into the crystal lattice. Further, the crystal of the phosphor belongs to the triclinic system, and the space group is P-1 (2).

Figure 11:
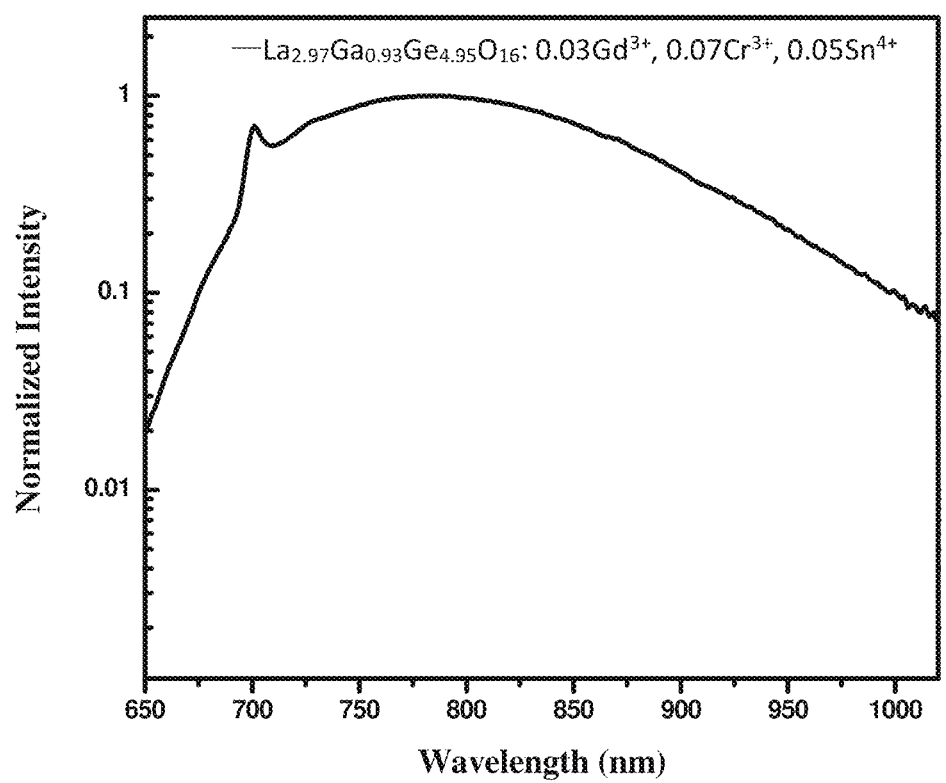
FIG. 11 is the photoluminescence emission spectrum (the excitation light has a wavelength of 450 nm) of the phosphor $La_{2.97}Ga_{0.93}Ge_{4.95}O_{16}$: $0.03Gd^{3\pm}$, $0.07Cr^{3+}$, $0.05Sn^{4+}$ according to Example 5.

As shown in FIG. 11, when excited by the excitation light of 450 nm, the emission spectrum of the phosphor covers a spectral range of 600-1100 nm, especially a spectral range of 650-1050 nm.

Based on the above test and characterization results, considering the ionic radius and valence state, it can be determined that the incorporation of $Cr^{3+}$ replaces $Ga^{3+}$ on the original site in the matrix lattice. Similarly, the incorporation of co-doped $Gd^{3+}$ and $Sn^{4+}$ replaces $La^{3+}$ and $Ge^{4+}$ on the original sites in the matrix lattice, respectively.

EXAMPLE 6

Figure 12:
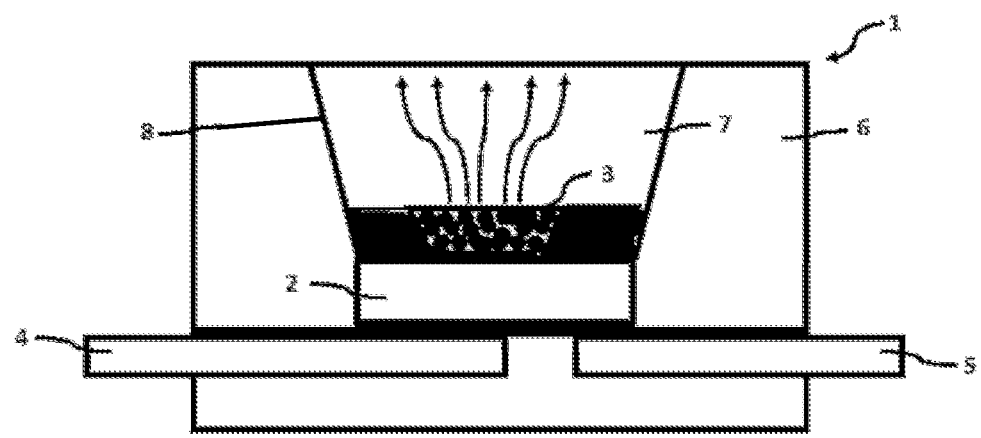
FIG. 12 is a schematic structural diagram of the optoelectronic component according to Example 6.

This example provides an optoelectronic component. As shown in FIG. 12, the optoelectronic component 1 includes a housing 6 provided with a recess 8, a semiconductor chip 2 for emitting a primary radiation, and a first lead 4 and a second lead 5 respectively connected to the a housing 6. An inner side wall of the recess 8 is coated with a suitable material to reflect the emitted light with the assistance of a reflector cup 7; the semiconductor chip 2 is mounted in the recess 8 and is respectively connected to the first lead 4 and the second lead 5 which are opaque; a conversion unit 3 is mounted on an optical path of the primary radiation emitted from the semiconductor chip 2. The conversion unit 3 contains or is provided with the phosphor according to Examples 1-5 described above. Specifically, the phosphor is dispersed in the epoxy resin, and the conversion unit 3 is produced and dispersed outside the semiconductor chip 2 to absorb the primary radiation emitted from the semiconductor chip 2 and convert into a secondary radiation.

The basic parameters of the above optoelectronic component 1 are shown in Table 1; under these basic parameters, the measurement results of the radiant flux obtained when part of the phosphors in Examples 1-5 is used for the conversion unit 3 are shown in Table 2.

TABLE 1

| LED packaging bracket | LED chip specifications | Silicone encapsulant | Phosphor content in the conversion unit |
|---|---|---|---|
| PPA3535 | Size: 40 mil * 40 mil Luminescence wavelength: 450-452.5 nm Power: 109.7 mW | 1.4 Silicone | 50 wt % |

TABLE 2

| Phosphor chemical formula | Total radiant flux | Radiant flux ($\lambda$ = 372-650 nm) | Radiant flux ($\lambda$ = 650-1050 nm) |
|---|---|---|---|
| $La_3Ga_{0.99}Ge_5O_{16}$: $0.01Cr^{3+}$ | 344.2 mW | 326.8 mW | 17.6 mW |
| $La_{2.97}Ga_{0.99}Ge_5O_{16}$: $0.03Gd^{3+}$, $0.01Cr^{3+}$ | 581.5 mW | 558.8 mW | 25.7 mW |
| $La_{2.97}Ga_{0.99}Ge_5O_{16}$: $0.03Yb^{3+}$, $0.01Cr^{3+}$ | 295.1 mW | 286.0 mW | 9.1 mW |
| $La_3Ga_{0.93}Ge_5O_{16}$: $0.07Cr^{3+}$ | 366.2 mW | 323.1 mW | 43.1 mW |
| $La_{2.97}Ga_{0.93}Ge_5O_{16}$: $0.07Cr^{3+}$, $0.03Gd^{3+}$ | 307.8 mW | 251.5 mW | 56.3 mW |
| $La_{2.67}Ga_{0.93}Ge_{4.95}O_{16}$: $0.07Cr^{3+}$, $0.03Gd^{3+}$, $0.05Sn^{4+}$ | 284.0 mW | 218.8 mW | 65.2 mW |

As can be seen from Table 2, the phosphor provided in the present application has a radiant flux of 4-70 mW in the wavelength range of 650-1050 nm and thus has a high radiant flux.

EXPERIMENTAL EXAMPLE 1

The present experimental example aims to investigate the effects of different doping concentrations of $Cr^{3+}$ on the radiant flux. Taking the phosphor having the general formula of $La_3Ga_{1-y}Ge_5O_{16}$: $yCr^{3+}$ ($0<y\leq 0.1$) as an example, the basic parameters of the optoelectronic component used for testing are shown in Table 1; the doping concentration of $Cr^{3+}$ and the corresponding radiant flux are shown in Table 3; the photoluminescence emission spectrums of phosphors with different doping concentrations of $Cr^{3+}$ are shown in FIG. 13; and a graph showing the relationship between the doping concentration of $Cr^{3+}$ and the radiant flux (the wavelength range is 650-1050 nm) is shown in FIG. 14.

TABLE 3

| Phosphor chemical formula | Doping concentration - $Cr^{3+}$ | Radiant flux ($\lambda$ = 650-1050 nm) |
|---|---|---|
| $La_3Ga_{0.995}Ge_5O_{16}$: $0.005Cr^{3+}$ | 0.5% | 9.1 mW |
| $La_3Ga_{0.99}Ge_5O_{16}$: $0.01Cr^{3+}$ | 1% | 17.6 mW |
| $La_3Ga_{0.97}Ge_5O_{16}$: $0.03Cr^{3+}$ | 3% | 31.0 mW |
| $La_3Ga_{0.95}Ge_5O_{16}$: $0.05Cr^{3+}$ | 5% | 34.1 mW |
| $La_3Ga_{0.93}Ge_5O_{16}$: $0.07Cr^{3+}$ | 7% | 43.1 mW |
| $La_3Ga_{0.91}Ge_5O_{16}$: $0.09Cr^{3+}$ | 9% | 38.6 mW |
| $La_3Ga_{0.89}Ge_5O_{16}$: $0.11Cr^{3+}$ | 11% | 30.3 mW |
| $La_3Ga_{0.87}Ge_5O_{16}$: $0.13Cr^{3+}$ | 13% | 28.6 mW |

Figure 13:
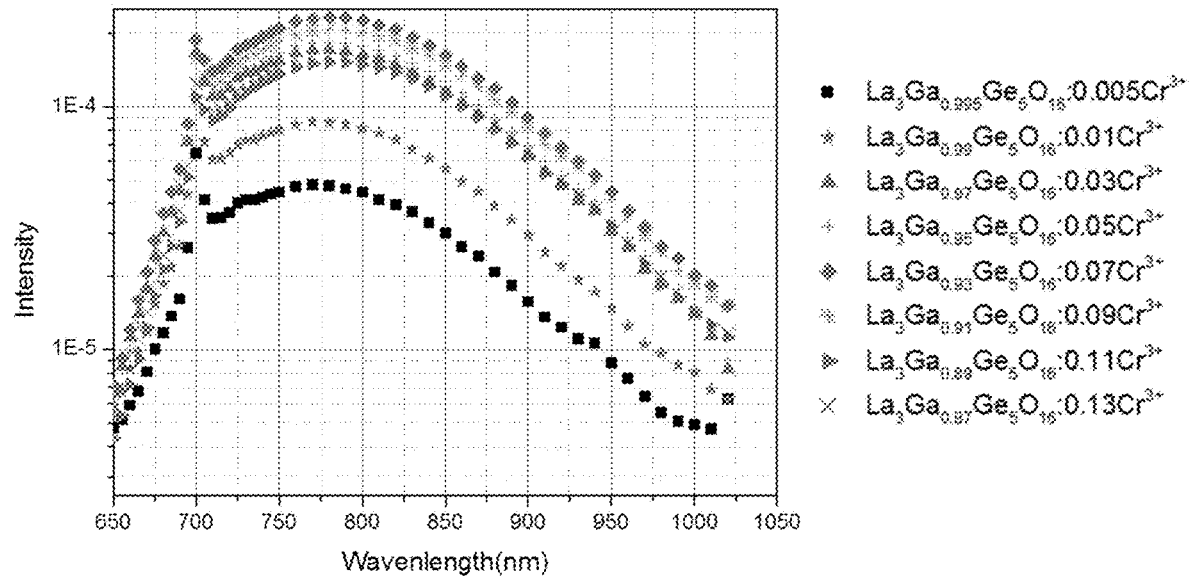
FIG. 13 is the photoluminescence emission spectrum (the excitation light has a wavelength of 450 nm) of the phosphor having different doping concentrations of $Cr^{3+}$ according to Experimental Example 1.
Figure 14:
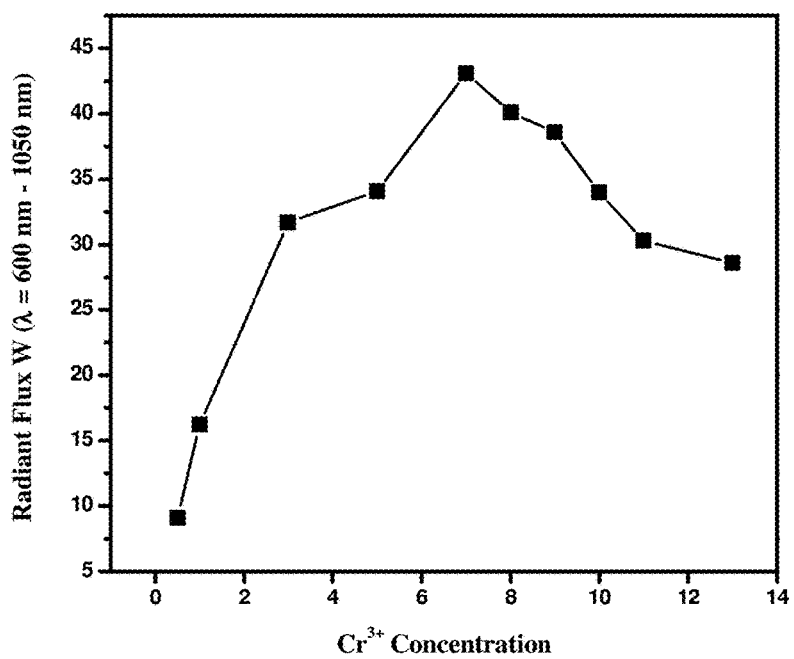
FIG. 14 is a graph showing the relationship between the doping concentration of $Cr^{3+}$ and the radiant flux according to Experimental Example 1.

As can be seen from Table 3 and FIG. 13-FIG. 14, in the phosphor $La_3Ga_{1-y}Ge_5O_{16}$: $yCr^{3+}$ ($0<y\leq 0.1$), when the doping concentration of $Cr^{3+}$ is not less than 0.5%, the radiant flux is higher than 9.0 mW; when the doping concentration of $Cr^{3+}$ is increased to 3.0%-11%, the radiant flux is higher than 30 mW. Moreover, as the doping concentration of $Cr^{3+}$ increases, the radiant flux first increases to the peak value accordingly and then decreases. When the doping concentration of $Cr^{3+}$ is about 7% (the corresponding phosphor is $La_3Ga_{0.93}Ge_5O_{16}$: $0.07Cr^{3+}$), the radiant flux reaches the highest of 43.1 mW.

EXPERIMENTAL EXAMPLE 2

The present experimental example aims to investigate the effects of different doping concentrations of $Gd^{3+}$ on the radiant flux Taking the phosphor having the general formula of $La_{3(1-x)}Ga_{1-y}Ge_5O_{16}$: $3xGd^{3+}$: $yCr^{3+}$ (0<3x+0.3, y=0.07) as an example, the basic parameters of the optoelectronic component used for testing are shown in Table 1; the doping concentration of $Gd^{3+}$ and the corresponding radiant flux are shown in Table 4; the photoluminescence emission spectrums of the phosphors with different doping concentrations of $Gd^{3+}$ are shown in FIG. 15; and a graph showing the relationship between the doping concentration of $Gd^{3+}$ and the radiant flux (the wavelength range is 650-1050 nm) is shown in FIG. 16.

TABLE 4

| Phosphor chemical formula | Doping concentration - $Gd^{3+}$ | Radiant flux ($\lambda$ = 650-1050 nm) |
|---|---|---|
| $La_{2.985}Ga_{0.93}Ge_5O_{16}$: $0.015Gd^{3+}$: $0.07Cr^{3+}$ | 0.5% | 51.0 mW |
| $La_{2.97}Ga_{0.93}Ge_5O_{16}$: $0.03Gd^{3+}$: $0.07Cr^{3+}$ | 1.0% | 56.3 mW |
| $La_{2.955}Ga_{0.93}Ge_5O_{16}$: $0.045Gd^{3+}$: $0.07Cr^{3+}$ | 1.5% | 55.6 mW |
| $La_{2.94}Ga_{0.93}Ge_5O_{16}$: $0.06Gd^{3+}$: $0.07Cr^{3+}$ | 2.0% | 44.7 mW |
| $La_{2.91}Ga_{0.93}Ge_5O_{16}$: $0.09Gd^{3+}$: $0.07Cr^{3+}$ | 3.0% | 42.2 mW |
| $La_{2.85}Ga_{0.93}Ge_5O_{16}$: $0.15Gd^{3+}$ $0.07Cr^{3+}$ | 5.0% | 32.7 mW |
| $La_{2.94}Ga_{0.93}Ge_5O_{16}$: $0.21Gd^{3+}$: $0.07Cr^{3+}$ | 7.0% | 25.6 mW |

Figure 15:
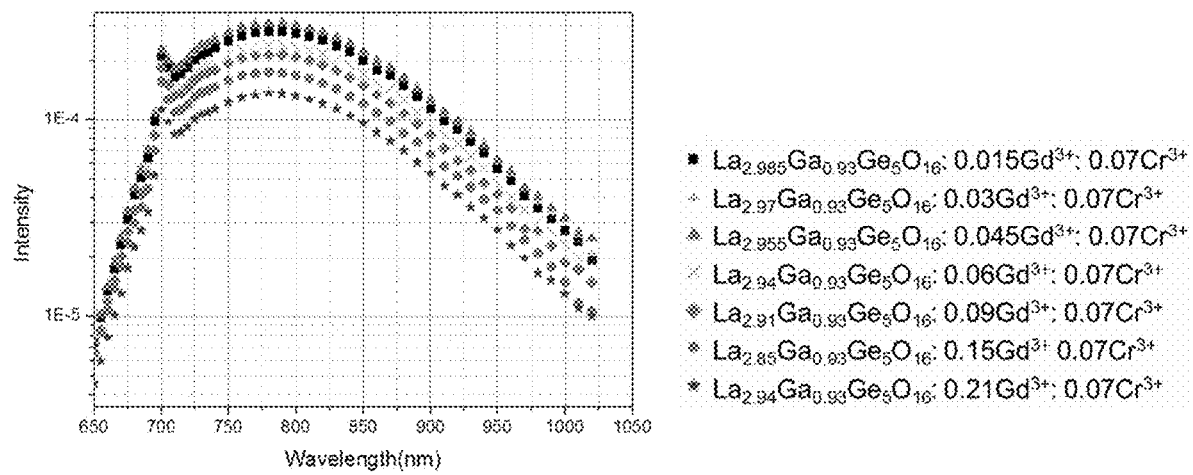
FIG. 15 is the photoluminescence emission spectrum (the excitation light has a wavelength of 450 nm) of the phosphor having different doping concentrations of $Gd^{3+}$ according to Experimental Example 2.
Figure 16:
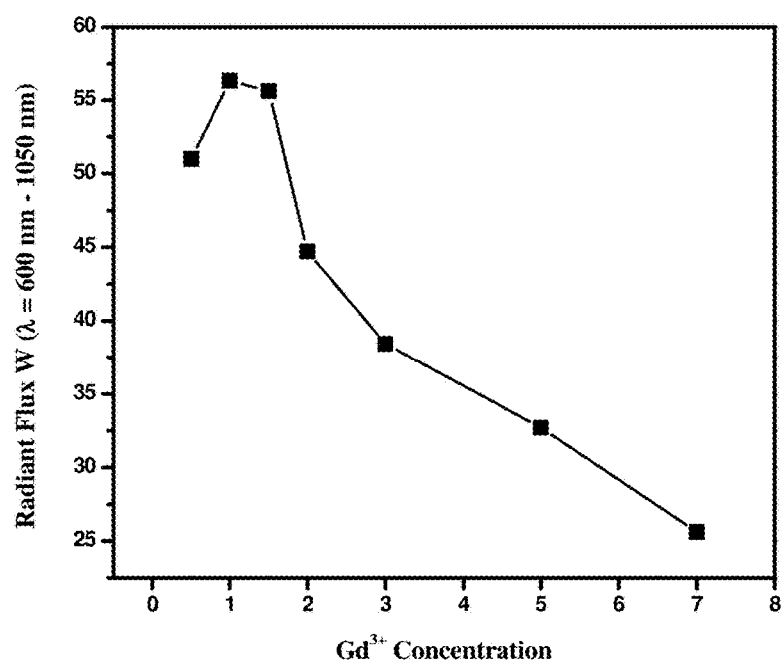
FIG. 16 is a graph showing the relationship between the doping concentration of $Gd^{3+}$ and the radiant flux according to Experimental Example 2.

As can be seen from Table 4 and FIG. 15-FIG. 16, in the phosphor $La_{3(1-x)}Ga_{1-y}Ge_5O_{16}$: $3xGd^{3+}$: $yCr^{3+}$, when the doping concentration of $Gd^{3+}$ is 0.5%-5%, the radiant flux is greater than 30 mW; when the doping concentration of $Gd^{3+}$ is 0.5%-1.5%, the radiant flux is even greater than 50 mW. Moreover, as the doping concentration of $Gd^{3+}$ increases, the radiant flux first increases to the peak value accordingly and then decreases. When the doping concentration of $Gd^{3+}$ is about 1% (the corresponding phosphor is $La_{2.97}Ga_{0.93}Ge_5O_{16}$: $0.03Gd^{3+}$: $0.07Cr^{3+}$), the radiant flux reaches the highest of 56.3 mW.

EXPERIMENTAL EXAMPLE 3

This experimental example aims to investigate the effects of different doping concentrations of $Sn^{4+}$ on the radiant flux. Taking the phosphor having the general formula of $La_{3(1-x)}Ga_{1-y}Ge_{5(1-z)}O_{16}$: $3xGd^{3+}$, $yCr^{3+}$, $5zSn^{4+}$ (3x=0.03, y=0.01, 0<5z≤0.2) as an example, the basic parameters of the optoelectronic component used for testing are shown in Table 1; the doping concentration of $Sn^{4+}$ and the corresponding radiant flux are shown in Table 5; the photoluminescence emission spectrums of phosphors with different doping concentrations of $Sn^{4+}$ are shown in FIG. 17; and a graph showing the relationship between the doping concentration of $Sn^{4+}$ and the radiant flux (the wavelength range is 650-1050 nm) is shown in FIG. 18.

TABLE 5

| Phosphor chemical formula | Doping concentration - $Sn^{4+}$ | Radiant flux ($\lambda$ = 650-1050 nm) |
|---|---|---|
| $La_{2.97}Ga_{0.99}Ge_{4.975}O_{16}$: $0.03Gd^{3+}$: $0.01Cr^{3+}$: $0.025Sn^{4+}$ | 0.5% | 47.0 mW |
| $La_{2.97}Ga_{0.99}Ge_{4.95}O_{16}$: $0.03Gd^{3+}$: $0.01Cr^{3+}$: $0.05Sn^{4+}$ | 1.0% | 65.2 mW |
| $La_{2.97}Ga_{0.99}Ge_{4.925}O_{16}$: $0.03Gd^{3+}$: $0.01Cr^{3+}$: $0.075Sn^{4+}$ | 1.5% | 50.3 mW |
| $La_{2.97}Ga_{0.99}Ge_{4.9}O_{16}$: $0.03Gd^{3+}$: $0.01Cr^{3+}$: $0.1Sn^{4+}$ | 2.0% | 41.5 mW |
| $La_{2.97}Ga_{0.99}Ge_{4.85}O_{16}$: $0.03Gd^{3+}$: $0.01Cr^{3+}$: $0.15Sn^{4+}$ | 3.0% | 40.9 mW |

Figure 17:
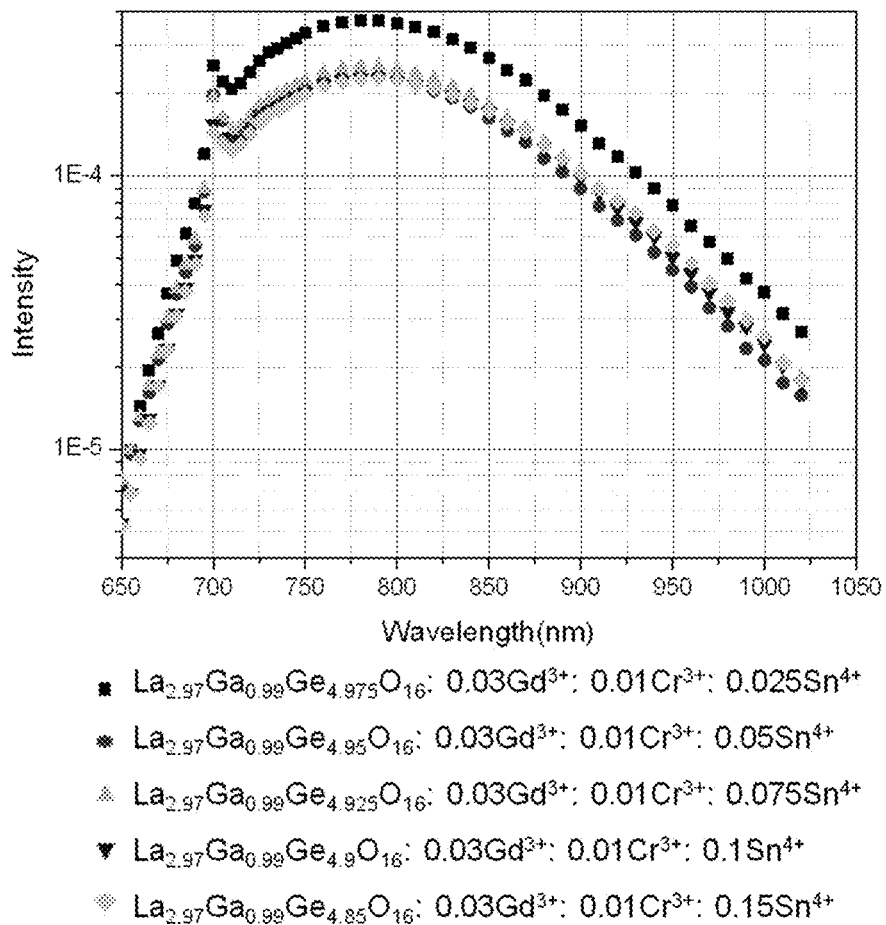
FIG. 17 is the photoluminescence emission spectrum (excitation light has a wavelength of 450 nm) of the phosphor having different doping concentrations of $Sn^{4+}$ according to Experimental Example 3.
Figure 18:
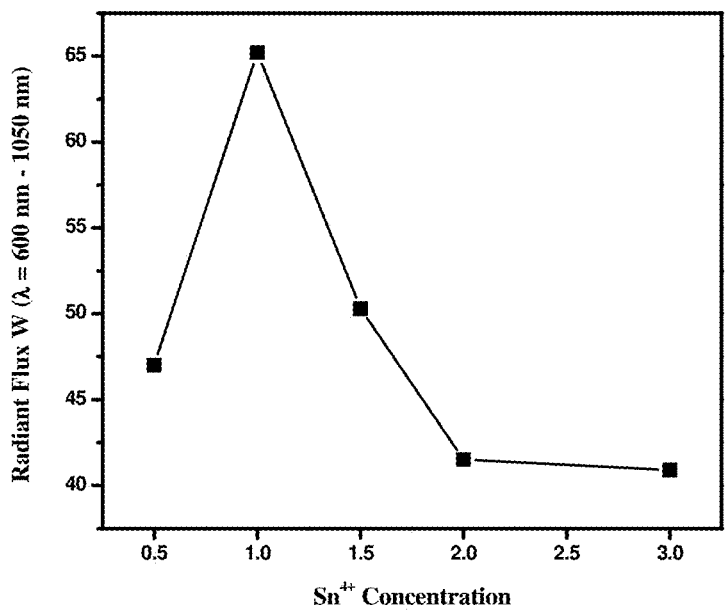
FIG. 18 is a graph showing the relationship between the doping concentration of $Sn^{4+}$ and the radiant flux according to Experimental Example 3.

As can be seen from Table 5 and FIG. 17-FIG. 18, in the phosphor $La_{3(1-x)}Ga_{1-y}Ge_{5(1-z)}O_{16}$: $3xGd^{3+}$, $yCr^{3+}$, $5zSn^{4+}$, when the doping concentration of $Sn^{4+}$ is greater than or equal to 0.5%, the radiant flux is greater than 40 mW. Moreover, as the doping concentration of $Sn^{4+}$ increases, the radiant flux first increases to the peak value accordingly and then decreases. When the doping concentration of $Sn^{4+}$ is about 1% (the corresponding phosphor is $La_{2.97}Ga_{0.99}Ge_{4.95}O_{16}$: $0.03Gd^{3+}$: $0.01Cr^{3+}$: $0.05Sn^{4+}$), the radiant flux reaches the highest of 65.2 mW.

COMPARATIVE EXAMPLE 1

Figure 19:
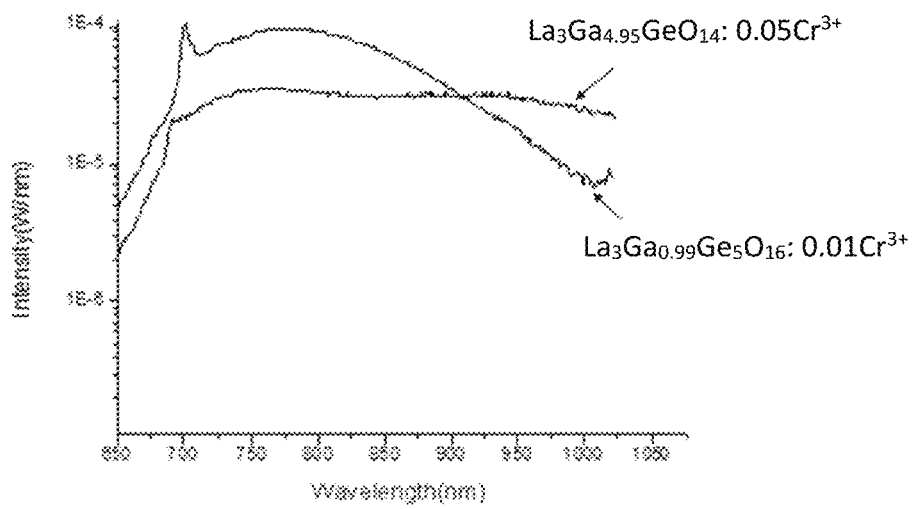
FIG. 19 is the photoluminescence emission spectrum (the excitation light has a wavelength of 450 nm) of the $La_3Ga_{0.99}Ge_5O_{16}$: $0.01Cr^{3+}$ and $La_3Ga_{4.95}Ge_{0.9}O_{14}$: $0.05Cr^{3+}$ according to Comparative Example 1.

The present comparative example provides a phosphor having a chemical formula of $La_3Ga_{4.95}GeO_{14}$: $0.05Cr^{3+}$ (the doping concentration of $Cr^{3+}$ is 1%), a comparison between the radiant flux of the phosphor and that of $La_3Ga_{0.99}Ge_5O_{16}$: $0.01Cr^{3+}$ is shown in Table 6; FIG. 19 is the photoluminescence emission spectrum of the above two phosphors. As shown in Table 6 and with reference to FIG. 19, in both the visible range of 372-650 nm and the red visible and near-infrared range of 650-1050 nm, the radiant flux of $La_3Ga_{4.95}GeO_{14}$: $0.05Cr^{3+}$ is significantly smaller than the radiant flux of $La_3Ga_{0.99}Ge_5O_{16}$: $0.01Cr^{3+}$, indicating that the phosphor provided in the present application is far superior to the conventional phosphors.

TABLE 6

| Phosphor chemical formula | Total radiant flux | Radiant flux ($\lambda$ = 372-650 nm) | Radiant flux ($\lambda$ = 650-1050 nm) |
|---|---|---|---|
| $La_3Ga_{4.95}GeO_{14}$: $0.05Cr^{3+}$ | 195.6 mW | 184.5 mW | 10.1 mW |
| $La_3Ga_{0.99}Ge_5O_{16}$: $0.01Cr^{3+}$ | 344.2 mW | 326.8 mW | 17.6 mW |

EXAMPLE 7

The present example provides a set of phosphors having the general formula of $La_3Ga_{5(1-x)}Ge_{1-y}O_{14}$: $5xCr^{3+}$, $ySn^{4+}$, where 0<x<0.1, y=0. The chemical formulae of the set of phosphors are as follows:

$La_3Ga_{4.95}GeO_{14}$: $0.05Cr^{3+}$ $La_3Ga_{4.75}GeO_{14}$: $0.25Cr^{3+}$ $La_3Ga_{4.55}GeO_{14}$: $0.45Cr^{3+}$

The preparing method of the set of phosphor is as follows: according to stoichiometric ratios in the molecular formulae of the set of phosphors, accurately weighing the raw materials $La_2O_3$, $Ga_2O_3$, $GeO_2$ and $Cr_2O_3$; placing the weighed raw materials in an agate mortar to grind for evenly mixing; then transferring the resulting mixture to an alumina crucible; placing in a tubular furnace and sintering in an air atmosphere; controlling the temperature at about 1300° C. to sinter for about 5 hours; and after cooling in the furnace, grinding into powders to obtain the phosphor.

Figure 20:
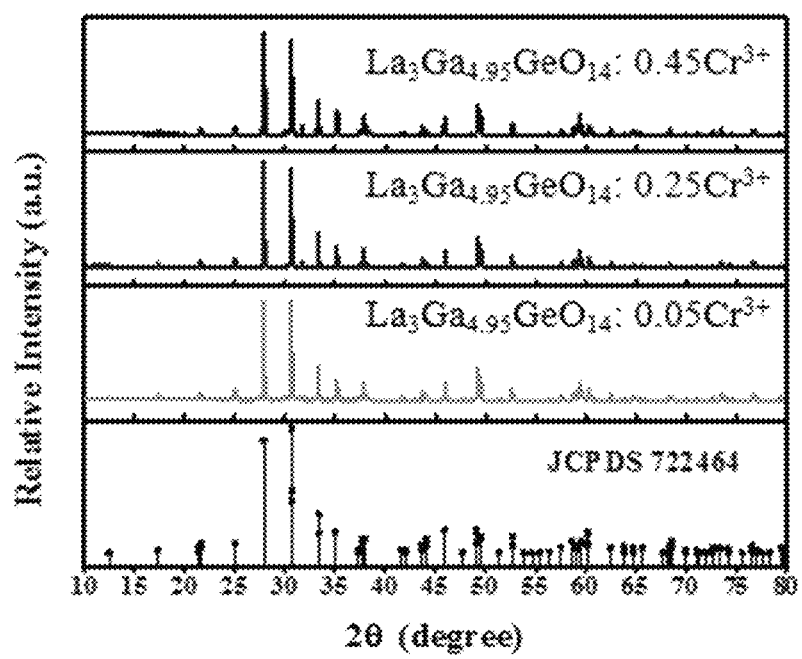
FIG. 20 is the X-ray diffraction spectrum of the phosphor according to Example 7.

As shown in FIG. 20, the XRD diffraction spectrums of the set of phosphors are compared with the standard spectrum JCPDS 722464 (ICSD-20783). The diffraction peaks of the set of phosphors are consistent with the standard spectrum and no impurity peak is detected, indicating that the activator $Cr^{3+}$ and the sensitizer $Sn^{4+}$ successfully entered into the crystal lattice. The crystals of the set of phosphors belong to the triclinic system, and the space group is P-1(2).

Figure 21:
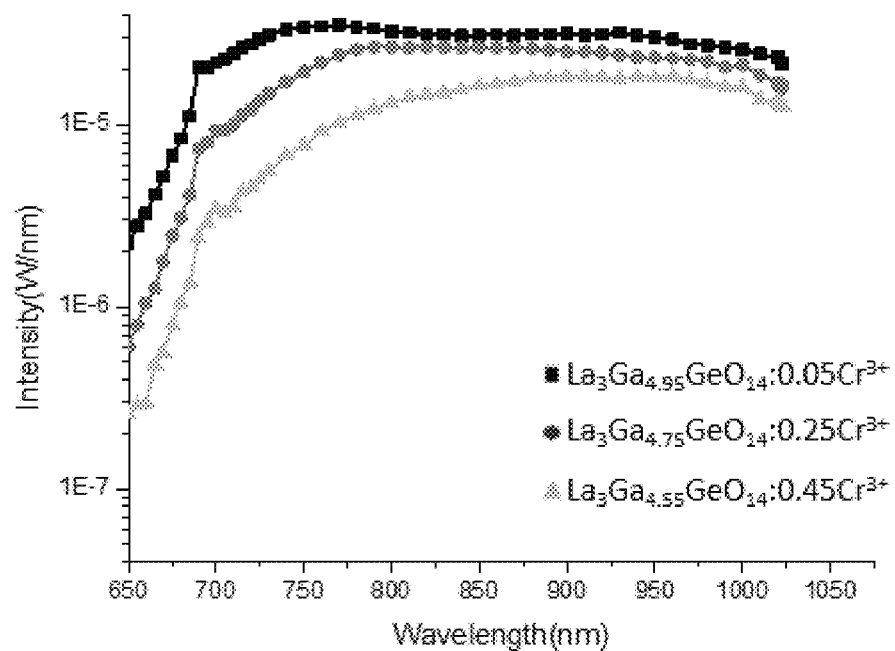
FIG. 21 is the photoluminescence emission spectrum (the excitation light has a wavelength of 460 nm) of the phosphor according to Example 7.
Figure 22:
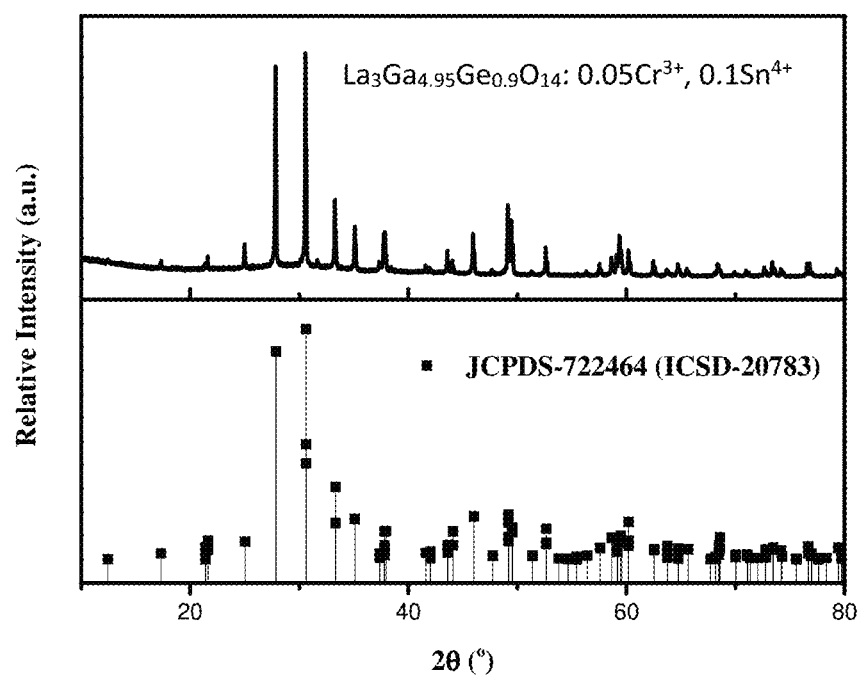
FIG. 22 is the X-ray diffraction spectrum of the phosphor $La_3Ga_{4.95}Ge_{0.9}O_{14}$: $0.05Cr^{3+}$, $0.1Sn^{4+}$ according to Example 8.
Figure 23:
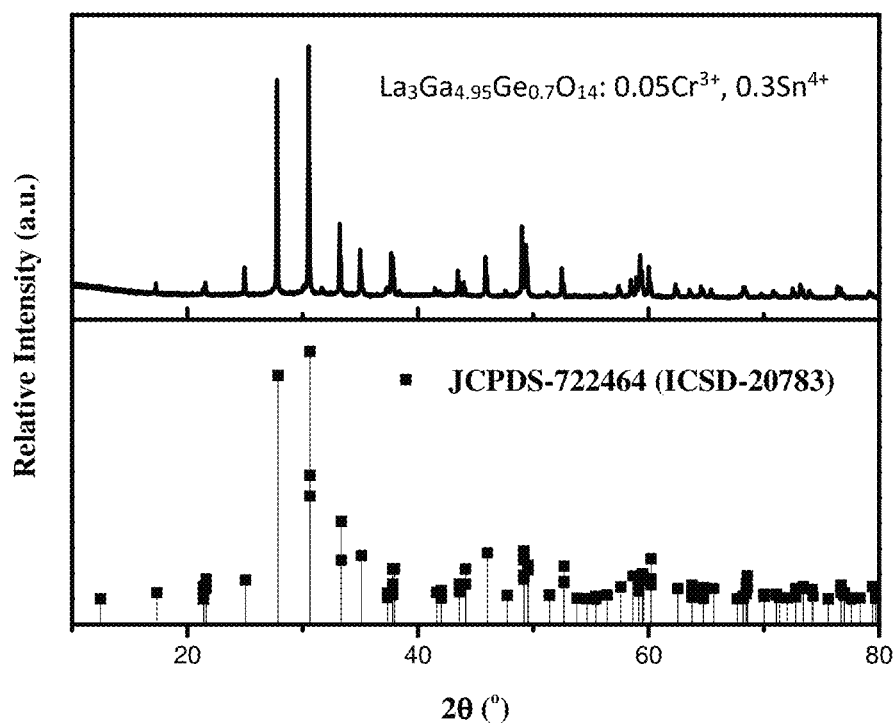
FIG. 23 is the X-ray diffraction spectrum of the phosphor $La_3Ga_{4.95}Ge_{0.7}O_{14}$: $0.05Cr^{3+}$, $0.3Sn^{4+}$ according to Example 8.
Figure 24:
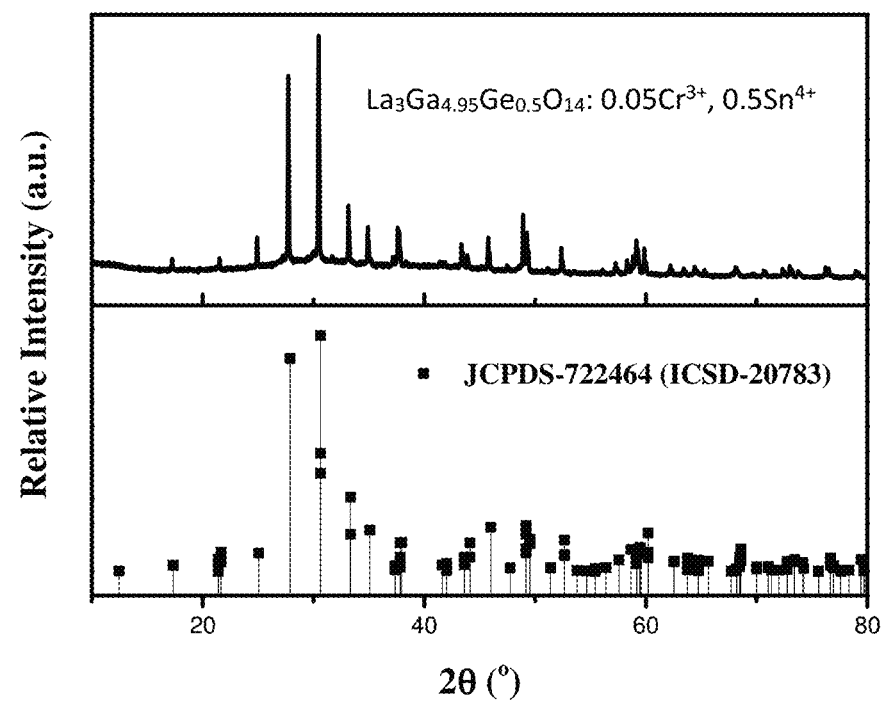
FIG. 24 is the X-ray diffraction spectrum of the phosphor $La_3Ga_{4.95}Ge_{0.5}O_{14}$: $0.05Cr^{3+}$, $0.5Sn^{4+}$ according to Example 8.

As shown in FIG. 21, when excited by the excitation light of 460 nm, the emission spectrum of the set of phosphors cover a range of 600-1250 nm, especially a range of 650-1050 nm.

EXAMPLE 8

The present example provides a set of phosphors having the general formula of $La_3Ga_{5(1-x)}Ge_{1-y}O_{14}: 5xCr^{3+}, ySn^{4+}$, where x=0.01, 0<y≤0.9. The chemical formulae of the set of phosphors are as follows:

$La_3Ga_{4.95}Ge_{0.9}O_{14}$: $0.05Cr^{3+}$, $0.1Sn^{4+}$;
$La_3Ga_{4.95}Ge_{0.7}O_{14}$: $0.05Cr^{3+}$, $0.3Sn^{4+}$;
$La_3Ga_{4.95}Ge_{0.5}O_{14}$: $0.05Cr^{3+}$, $0.5Sn^{4+}$.

The preparing method of the set of phosphors is as follows: according to stoichiometric ratios in the molecular formulae of the set of phosphors, accurately weighing the raw materials $La_2O_3$, $Ga_2O_3$, $GeO_2$, $SnO_2$ and $Cr_2O_3$; and placing the weighed raw materials in an agate mortar to grind for evenly mixing; then transferring the resulting mixture to an alumina crucible; placing in a muffle furnace and sintering in an air atmosphere; controlling the temperature at about 1250° C. to sinter for about 5 hours; and after cooling in the furnace, grinding into powders to obtain the phosphor.

As shown in FIG. 11-FIG. 24, the X-ray diffraction spectrums of the set of phosphors are compared with the standard X-ray diffraction spectrum. All the diffraction peaks of the set of phosphors are consistent with the standard spectrum JCPDS 722464 (ICSD-20783) and no impurity peak is detected, indicating that the activator $Cr^{3+}$ and the sensitizer $Sn^{4+}$ successfully entered into the crystal lattice. Further, the crystals of the set of phosphors belong to the triclinic system, and the space group is P-1(2).

Figure 25:
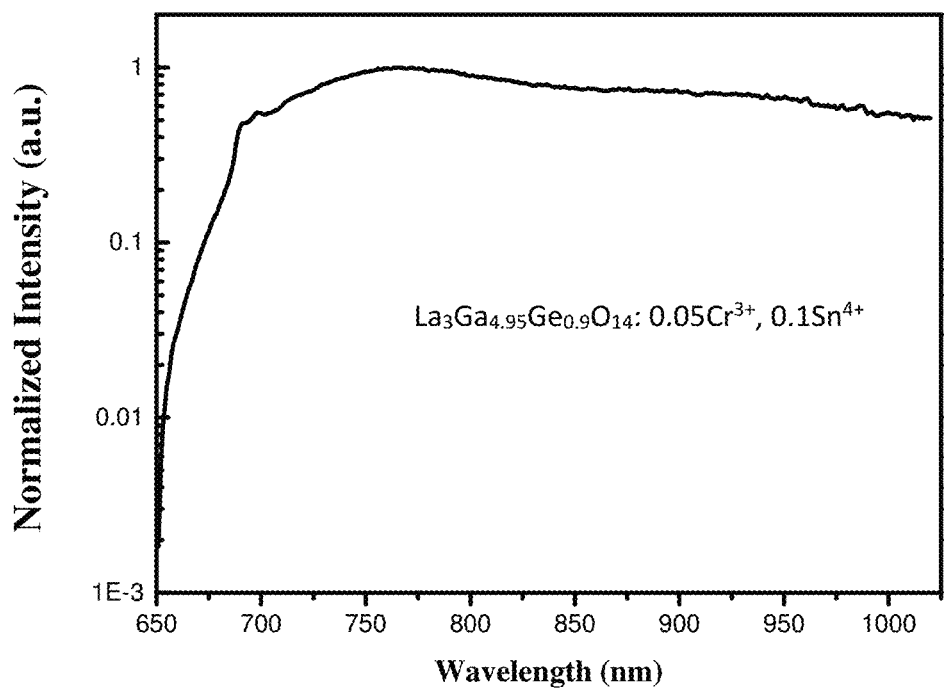
FIG. 25 is the photoluminescence emission spectrum (the excitation light has a wavelength of 460 nm) of the phosphor $La_3Ga_{4.95}Ge_{0.9}O_{14}$: $0.05Cr^{3+}$, $0.1Sn^{4+}$ according to Example 8.
Figure 26:
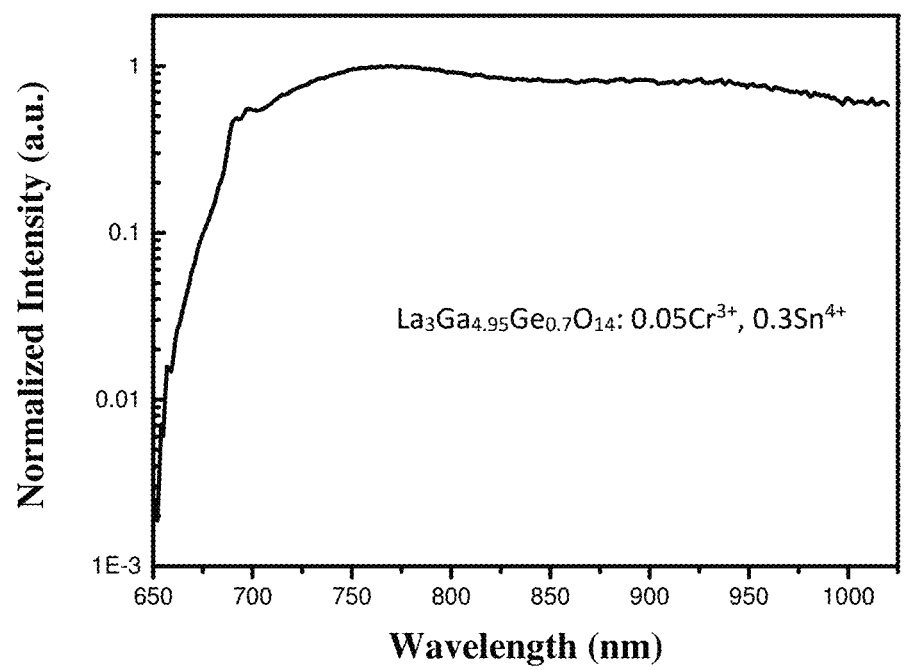
FIG. 26 is the photoluminescence emission spectrum (the excitation light has a wavelength of 460 nm) of the phosphor $La_3Ga_{4.95}Ge_{0.7}O_{14}$: $0.05Cr^{3+}$, $0.3Sn^{4+}$ according to Example 8.
Figure 27:
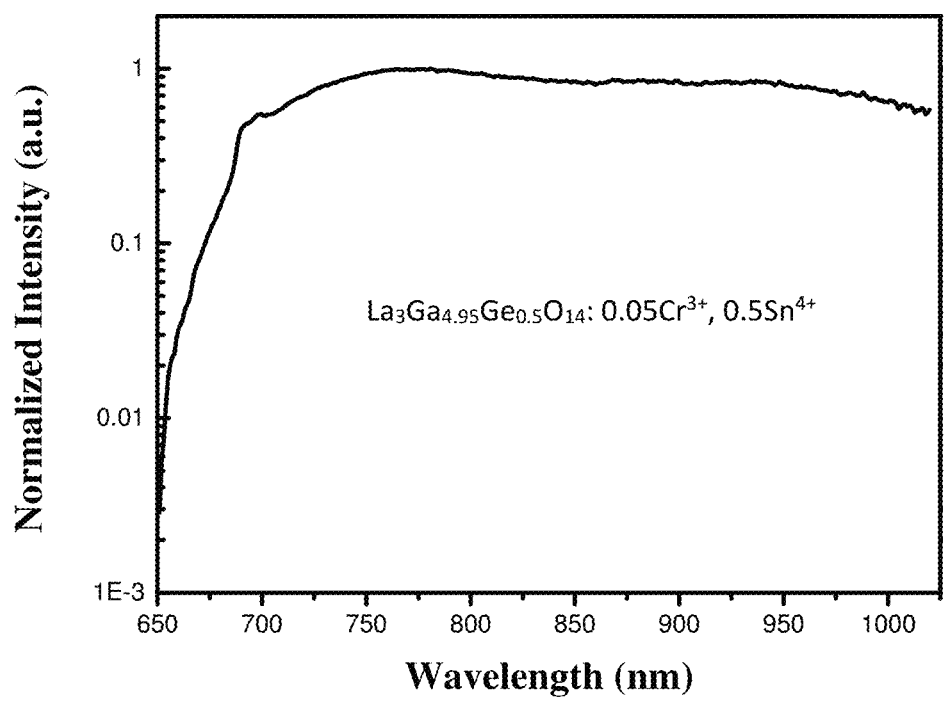
FIG. 27 is the photoluminescence emission spectrum (the excitation light has a wavelength of 460 nm) of the phosphor $La_3Ga_{4.95}Ge_{0.5}O_{14}$: $0.05Cr^{3+}$, $0.5Sn^{4+}$ according to Example 8.

As shown in FIG. 25-FIG. 27, when excited by the excitation light of 460 nm, the emission spectrums of the set of phosphors cover a range of 600-1100 nm, especially a range of 650-1050 nm.

EXAMPLE 9

Figure 28:
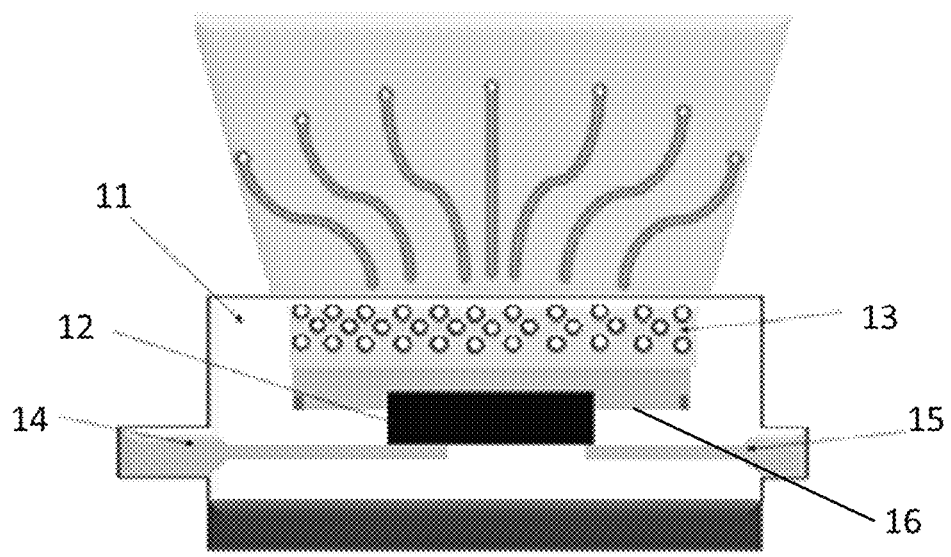
FIG. 28 is a schematic structural diagram of the optoelectronic component according to Example 9 of the present application.

The present example provides an optoelectronic component. As shown in FIG. 28, the optoelectronic component includes a housing 11 provided with a recess 16, a semiconductor chip 12 for emitting a primary radiation, and a first lead 14 and a second lead 15 respectively connected to the housing 11. An inner side wall of the recess 16 is coated with a suitable material to achieve a selective reflection of light; the semiconductor chip 12 is mounted in the recess 16 and is respectively connected to the first lead 14 and the second lead 15 which are opaque. a conversion unit 13 is mounted on an optical path of the primary radiation emitted from the semiconductor chip 12. The conversion unit 13 contains or is provided with the phosphor according to Example 7 described above. Specifically, the phosphor is dispersed in the epoxy resin, and the conversion unit 13 is produced and dispersed outside the semiconductor chip 12 to absorb the primary radiation emitted from the semiconductor chip 12 and converted into a secondary radiation.

The basic parameters of the above optoelectronic component are shown in Table 7; under these basic parameters, the measurement results of the radiant flux obtained when part of the phosphors provided in Example 7 is used for the conversion unit 13 are shown in Table 8. The measurement results of the radiant flux obtained when part of the phosphors provided in Example 8 is used for the conversion unit 13 are shown in Table 9.

TABLE 7

| LED packaging bracket | LED chip specifications | Silicone encapsulant | Phosphor content in the conversion unit |
|---|---|---|---|
| PPA3535 | Size: 40 mil * 40 mil Luminescence wavelength: 450-452.5 nm Power: 109.7 mW | 1.4 Silicone | 50 wt % |

TABLE 8

| Phosphor chemical formula | Doping concentration - $Cr^{3+}$ | Radiant flux ($\lambda$ = 650-1050 nm) |
|---|---|---|
| $La_3Ga_{4.95}GeO_{14}$: $0.05Cr^{3+}$ | 1% | 10.5 mW |
| $La_3Ga_{4.75}GeO_{14}$: $0.25Cr^{3+}$ | 5% | 7.8 mW |
| $La_3Ga_{4.55}GeO_{14}$: $0.45Cr^{3+}$ | 9% | 4.7 mW |

As shown in Table 8, as the doping concentration of $Cr^{3+}$ is gradually increased, the radiant flux is correspondingly decreased, but when the doping concentration of $Cr^{3+}$ is 9%, the radiant flux corresponding to the phosphor is still greater than 4 mW.

TABLE 9

| Phosphor chemical formula | Total radiant flux | Radiant flux ($\lambda$ = 372-650 nm) | Radiant flux ($\lambda$ = 650-1050 nm) |
|---|---|---|---|
| $La_3Ga_{4.95}Ge_{0.9}O_{14}$: $0.05Cr^{3+}$, $0.1Sn^{4+}$ | 150.6 mW | 135.8 mW | 14.8 mW |
| $La_3Ga_{4.95}Ge_{0.7}O_{14}$: $0.05Cr^{3+}$, $0.3Sn^{4+}$ | 125.3 mW | 111.5 mW | 13.8 mW |
| $La_3Ga_{4.95}Ge_{0.5}O_{14}$: $0.05Cr^{3+}$, $0.5Sn^{4+}$ | 157.9 mW | 143.6 mW | 14.3 mW |

Finally, it should be noted that the above examples are only used to illustrate the technical solutions of the present application, rather than limiting the present application; a person skilled in the art may still modify the technical solutions described in the foregoing examples, or make equivalent replacements to some or all of the technical features therein. However, these modifications or replacements do not make the essence of corresponding technical solutions depart from the scope of the technical solutions in the examples of the present application, but should fall into the scope of the claims and specification of the present application.

What is claimed is:

1. A phosphor comprising the following general formula: $La_{3(1-x)}Ga_{1-y}Ge_{5(1-z)}O_{16}$: $3xA^{3+}$, $yCr^{3+}$, $5zB^{4+}$, wherein x<1,0<y<1, z<1, and x and z do not equal to 0 simultaneously;
A represents at least one of Gd and Yb; and
B represents at least one of Sn, Nb, and Ta.

2. The phosphor according to claim 1, wherein 0<3x≤0.3, 0<y≤0.2, 0≤5z≤0.2.

3. The phosphor according to claim 1, wherein $0 \leq 3x \leq 0.3$, $0<y \leq 0.2$, $0<5z \leq 0.2$.

4. The phosphor according to claim 1, further comprising the following general formula:

$La_{3(1-x)}Ga_{1-y}Ge_5O_{16}$: $3xA^{3+}$, $yCr^{3+}$, wherein $0<3x \leq 0.3$, $0<y \leq 0.2$.

5. The phosphor according to claim 1, further emitting light in a range of 600-1500 nm when excited by the excitation light having a wavelength of 400-500 nm.

6. The phosphor according to claim 5, further emitting the light comprising a radiant flux 4-70 mW.

7. The phosphor according to claim 1, being prepared by a method comprising steps of:

Weighing starting precursors selected from oxide or carbonate containing materials and mixing raw materials for providing elements in the general formula according to the general formula of the phosphor, then sintering at a temperature of 1200-1500° C. for about 5-6 hours to obtain the phosphor.

8. The phosphor according to claim 1, being prepared by a method comprising steps of:

Preparing and mixing raw materials for providing elements in the general formula according to the general formula of the phosphor, then sintering at a temperature of 1200-1500° C. to obtain the phosphor.

9. An optoelectronic component, comprising:
a semiconductor chip for emitting excitation light during operation of the optoelectronic component; and
a conversion unit provided with the phosphor according to claim 1 for converting the excitation light into emitted light.

10. The optoelectronic component according to claim 9, wherein the excitation light has a wavelength of 450 nm or 460 nm, and the emitted light has a wavelength of 650-1050 nm.

11. The optoelectronic component according to claim 9, wherein the semiconductor chip is a blue LED chip.

12. A method for producing an optoelectronic component, comprising steps of:
producing a conversion unit on which the phosphor according to claim 1 is provided; and
mounting the conversion unit on a semiconductor chip, wherein the semiconductor chip is used to generate excitation light during operation of the optoelectronic component.

* * * * *